(12) United States Patent
Yoshida et al.

(10) Patent No.: US 6,944,521 B2
(45) Date of Patent: Sep. 13, 2005

(54) METHOD OF PROVIDING BOARD PACKAGING LINE PROGRAM

(75) Inventors: Hiroshi Yoshida, Kyoto (JP); Yoshihiro Nagao, Kyoto (JP); Takeshi Nakata, Takatsuki (JP); Masanobu Tanigami, Fukuchiyama (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/674,788

(22) Filed: Oct. 1, 2003

(65) Prior Publication Data

US 2005/0102052 A1    May 12, 2005

(30) Foreign Application Priority Data

| Oct. 2, 2002 | (JP) | .............................. 2002-290379 |
| Jan. 21, 2003 | (JP) | .............................. 2003-012859 |
| Sep. 4, 2003 | (JP) | .............................. P2003-312739 |

(51) Int. Cl.[7] ........................................... G06F 9/445
(52) U.S. Cl. ..................................... 700/169; 717/178
(58) Field of Search .......................... 700/2–5, 9, 159, 700/160, 169, 173, 179; 717/120, 121, 162–164, 717/167–178; 719/321–327

(56) References Cited

U.S. PATENT DOCUMENTS

| 6,607,314 B1 * | 8/2003 | McCannon et al. ........... 400/62 |
| 6,631,416 B2 * | 10/2003 | Bendinelli et al. .......... 709/227 |
| 6,779,004 B1 * | 8/2004 | Zintel .......................... 709/227 |
| 2003/0079132 A1 * | 4/2003 | Bryant ........................ 713/182 |
| 2004/0088180 A1 * | 5/2004 | Akins, III ..................... 705/1 |

FOREIGN PATENT DOCUMENTS

| JP | 11-298200 A | 10/1999 |
| JP | 2002-236513 A | 8/2002 |
| JP | 2002-278612 A | 9/2002 |
| JP | 2002-280278 A | 9/2002 |

* cited by examiner

Primary Examiner—Maria N. Von Buhr
(74) Attorney, Agent, or Firm—Foley & Lardner LLP

(57) ABSTRACT

A method of providing a program for a printed board packaging line is disclosed. A board packaging line coordinating computer downloads the service contract information and the application program contained in the contract information from an application server, and defines the board packaging line covered by the program and the device configuration of the line. The device configuration thus defined is uploaded to the application server, which, based on the device configuration thus uploaded, searches a prepared device driver group for a required device driver. This device driver is downloaded and set in each device by the board packaging line coordinating computer.

12 Claims, 24 Drawing Sheets

Application program operated on server

Application program acquired from server and operated on client

Fig. 4A

| Data |
|---|
| Number of records |
| Record 1 |
| ... |
| Record n |

Data structure of data storage

Fig. 4B

| Data |
|---|
| Board ID |
| Solder paste printing work starting time |
| Solder paste printing work finish time |
| Solder paste print inspection starting time |
| Solder paste print inspection result information |
| Solder position information |
| Solder height information |
| Solder paste print inspection finish time |
| Part mounting work starting time |
| Part mounting work finish time |
| Mounted parts inspection starting time |
| Mounted parts inspection result information |
| Mounted parts inspection finish time |
| Mounted parts position information |
| Reflow starting time |
| In-reflow temp information |
| Reflow finish time |
| Reflow solder inspection starting time |
| Reflow solder inspection result information |
| Reflow solder inspection finish time |
| Additional measuring device information 1 |
| ... |
| Additional measuring device information 2 |

Contents of each record

Fig. 10A

| Data |
|---|
| Production line name |
| Number of devices |
| Device designating information 1 |
| ... |
| Device designating information n |

Service setting information

Fig. 10B

| Data |
|---|
| Device type |
| Device name |
| Device instance name |

Device designating information

Fig. 10C

| Data |
|---|
| Production line name |
| Solder paste printing device Device designating information |
| Solder paste print inspection device Device designating information |
| Mounter device designating information 1 |
| Mounter device designating information 2 |
| Mounter device designating information 3 |
| Mounted parts inspection device Device designating information |
| Reflow furnace device designating information |
| Reflow solder inspection device Device designating information |

Service parameters

Data structure of program pool

Contents of each record

Customer data base

Contents of record

Contents of contract information

Fig. 20

| Name | Description |
|---|---|
| Service contract ID No. | Number for specifying service contract managed by server in correspondence with customer information |
| Service contract name | Title name |
| Effective period starting date | Starting day of period during which execution of application program is permitted under contract |
| Last date of effective period | Last day of the period during which execution of application program is permitted under contract |
| Client ID | ID of user site service client permitted to execute the application program |
| Program ID | ID for designating the application program that can be used under contract |
| SP option character string | Character string read by application program and used for option setting (on/off of specific function). Format dependent on US application program |
| Applicable line ID | ID indicating line covered by the contract |
| Maximum number of registered devices | Limited value of total number of devices registered on applicable line under contract |
| Number of device registration changes allowed | Number of configuration changes allowed after starting application program |
| Effective period of information | Effective period from contract information acquisition by user site service client from server. In the case where data is exchanged with server and effective period is not renewed before expiry thereof, client software prohibits execution of the application program.<br>*Effective period of 0 day indicates no effective period. |

METHOD OF PROVIDING BOARD PACKAGING LINE PROGRAM

BACKGROUND OF THE INVENTION

1. Field of the Invention

The present invention relates to a method of providing, through an internet, an optimum application program for production and quality control on a printed board packaging line of a customer, based on a service providing contract with the customer.

2. Description of the Prior Art

As well known, a board packaging line for automatically packaging electronic parts or the like on a printed circuit board is configured of various processing devices including a cream solder printing device, a parts mounting device (mounter) and a reflow furnace device. Each processing device is accompanied by an inspection device for determining whether the processing result is conforming or non-conforming. In the case where a printing failure is determined by an inspection device attached to the cream solder printing device, for example, the defective board is removed from the line. In similar fashion, in the case where a part mounting defect is determined by the inspection device attached to the parts mounter, the circuit board having the particular mounting defect is removed from the line or repaired.

The cream solder printing process in the cream solder printing device has various parameters (such as the positioning accuracy, squeeze angle and the printing pressure) affecting the printing result. Also, the parts mounting process in the parts mounter has various parameters (such as the mounting accuracy, the mounting height accuracy and the mounting weight control) affecting the result of mounting the parts. In similar fashion, the reflow process in the reflow furnace device has various parameters (such as the preheating profile, the overheating profile and the temperature equalization) affecting the reflow processing result.

In the case where a given board is determined as defective after the reflow process, not only the parameters for the reflow process but also the parameters for the cream solder printing process or the parts mounting process may have had an effect. It is not an easy matter to trace the cause of the defect and take the necessary protective measures based only on the result of the board inspection after the reflow process.

In view of this, an automatic quality control system has been conventionally known, as disclosed in Japanese Unexamined Patent Publication No. 11-298200, in which the measurement data for each step with the measures taken in the past to eliminate defects are stored in a data base, and in the case where a defect occurs, the data base is accessed by use of the measurement data newly obtained. In this way, the cause involved is estimated and the required measures are taken to eliminate the defect quickly.

The development of software for estimating the defect source required to implement the automatic quality control system described above takes a vast amount of time and labor. In the manufacturing fields where the multi-item scant production is becoming the mainstay of the day, on the other hand, the system configuration of the board packaging line as well as the board to be packaged undergoes frequent changes. In addition, the boards, the electronic parts, the soldering and packaging techniques used on the board packaging line are making rapid progress every year, and there is an increasing tendency to introduce an environment-friendly material which can meet the requirements for the miniaturization and the increased number of the packaged parts. Therefore, a defect source estimation software, if developed after vigorous effort, is generally short in life.

Various software for production and quality control on the board packaging line such as the defect source estimation software described above, if introduced rapidly and inexpensively through an internet, could conveniently benefit many electronic device manufactures equipped with the board packaging line. At the same time, the provision of these software through an internet for due and assured consideration will also be of benefit to the software providers.

A system is known for providing the service in the form of software to the customer rapidly at a low operation cost through an internet. The provision of the service through the internet finds applications primarily in the field of what is called the office automation including the group schedule management and the outsourcing of the financial management. Generally, the services offered through the network have the advantages described below as compared to the method of distributing a software package off line.

The first advantage is the ease with which the application version is upgraded or the specification is changed due to the fact that the applications are managed centrally by the server. As a result, the customer can always use the latest application without special procedure, and the service provider can supply the service to the customer at a low operation cost.

The second advantage is the versatility with which the charging system and the cost burden such as the monthly fee can be changed in accordance with the actual situation of each user. As a result, the service provider can employ a variety of charging methods such as the specific charge and the fixed periodical charge. The customer can be charged satisfactorily for the real amount of the service received.

Successful development of this service provision system using the internet for an application service targeted at the board packaging line for factory automation (FA) such as "the production defect source determining service for the board packaging line" requires consideration of the situations specific to the board packaging line as described below.

According to an application program, a great amount of data including the measurements and the result of inspection from each device on a board packaging line are required to be collected and analyzed real time (first situation). The data acquired by the application program from the devices on the board packaging line may contain the manufacturing information and the manufacturing know-how highly confidential to the customer (second situation). In many cases, the manufacturing sites, where the devices on the board packaging line constituting the object of application are installed, provide an environment both unsatisfactory and expensive for internet connection (third situation). The system configuration of the production line constituting an object of application requires the removal of a given device or the replacement of a given type of device with another for adjustment of the product lines and the equipment maintenance on the part of the customer (fourth situation).

In view of the situations described above, the problem points of two conventional methods for providing the application service using the internet are described below with reference to FIG. 24.

The first conventional method is to operate an application program on a server. In this method, as shown in FIG. 24, the data acquired real time by the client software from the various devices of the board packaging line through a device driver are sent to the server through the internet so that the server executes the application program, and the result of this execution is returned to the client software in what is called "the Web computing". The provision of the application service by this method targeted at the packaging line for factory automation poses the problem described below.

As apparent from the first situation, the data acquired from the devices on the board packaging line is vast in amount, and from the viewpoint of the communication burden, it is difficult for an application on the server to collect the data real time through the internet. An attempt to solve this problem would make it necessary for the customer to introduce a large scale of internet connection environment having a very high communication speed into the manufacturing field to receive the service.

As apparent from the second situation described above, it is problematic from the viewpoint of security for the application on the server to collect the data acquired from the various devices on the board packaging line through the internet. A security measure such as encryption of communication on the internet may be one solution, but the risk of information leakage and the anxiety on the part of the customer cannot be totally obviated.

As apparent from the first and third situations, according to this method, the customer cannot receive the service unless the client is connected to the server. To solve this problem and enable the customer to receive the service, a connection environment with the internet kept connected or the like environment is required in the manufacturing field.

The second conventional method consists in acquiring an application from the server and operating the application on the client. In this method, as shown in FIG. 24, the application is downloaded from the server and operated on the client software. This method can solve the problem of the first conventional method but still poses the problem described below.

As apparent from the third situation described above, it is difficult to remotely control from the server the operation of the application on the client software unless connected to the internet.

As apparent from the fourth situation described above, the customer is required to reinstall the application program in accordance with the system configuration of the production line each time the system configuration is changed. This requires a great number of steps and causes a trouble. The customer is required to reacquire an application program corresponding to the changed system configuration from the server. The third situation, however, makes it difficult for the customer to change the system configuration in simplistic way.

As apparent from the third situation, it is difficult for the server to carry out accurate specific charge by grasping the information unique to the application targeted at the packaging line for factory automation corresponding to, for example, the number of boards processed, the number of times a specific algorithm is executed, the monitoring time, the number of times the instruction for a specific job is issued, etc.

SUMMARY OF THE INVENTION

The invention has been developed taking the aforementioned problems into consideration, and the object thereof is to provide a method of providing a board packaging line program, in which an application program in software form of the know-how relating to a board packaging line is supplied from a server and operated on a client machine installed on the customer side, the client machine and the board packaging line are connected to each other by a network, and the data from the devices on the board packaging line can be collected real time by the application program.

Another object of the invention is to provide a method of providing a board packaging line program, in which the latest, optimum application program and a device driver can be supplied to the customer through an internet and set up with the client automatically.

Still another object of the invention is to provide a method of providing a board packaging line program, in which the operation of an application program on the client machine can be controlled remotely from the server in accordance with the terms and conditions of the contract signed with the customer.

Yet another object of the invention is to provide a method of providing a board packaging line program, in which the customer can change the system configuration constituting an object of the application program within the scope of the contract.

A further object of the invention is to provide a method of providing a board packaging line program, in which the charge operation record (the number of boards processed, the number of times a specific algorithm is executed, the monitoring time and the number of times the instruction for a specific job is issued) in the board packaging line produced on the client machine are accurately collected by the server to enable the server to carry out versatile charge on the basis of the information thus collected.

A still further object of the invention is to provide a method of providing a board packaging line program, in which the foregoing objects are achieved even in the situation with the client machine installed in an environment where the internet cannot be connected.

According to the invention, there is provided a method of providing a board packaging line program for a system in which a board packaging line coordinating computer connected through a network with the devices making up a board packaging line is connected, through an internet, with an application server having stored therein an application program to be supplied to the board packaging line coordinating computer.

This method comprises the steps described below. In the first step, the service contract information prepared based on the contract signed with the customer and the application program stipulated in the contract information are downloaded from the application server by the board packaging line coordinating computer.

In the second step, the board packaging line coordinating computer, based on the contract information, defines the board packaging line covered by the application program and the device configuration of the same line while at the same time uploading the defined configuration to the application server.

In the third step, the required device driver is retrieved from a group of device drivers by the application server based on the device configuration uploaded from the board packaging line coordinating computer.

In the fourth step, the retrieved device driver is downloaded from the application server and set in each device by the board packaging line computer. According to the invention, the application program is usable for any of applications including the set-up management, the time-lapse variation management and the defect source estimation or any combination thereof.

In the invention, the service contract information is prepared with each board packaging line as a basic unit and may include the information such as the applicable board packaging line coordinating computer identification information, the board packaging line identification information and the application program identification information used for the particular line, the number of registrable devices and the number of changeable devices.

In the invention, the board packaging line covered by the application program and the devices constituting the board packaging line are defined by the board packaging line coordinating computer having the client identification information contained in the service contract information, from the line identification information of the service contract information, the program identification information and the number of the registrable devices, while at the same time setting the input/output correspondence between the application program and the applicable device.

With this configuration, the latest and optimum application program and device driver can be supplied to the customer through the internet and set up in the client automatically.

According to the invention, in the case where the device configuration is changed for the board packaging line after introducing a predetermined application program to the board packaging line, assume that the scope of device configuration change is not more than the number of the changeable devices contained in the original service contract information. Without changing the terms and conditions of the contract, the board packaging line coordinating computer changes the device configuration used for the line, while at the same time setting the device driver corresponding to the changed device configuration and resetting the data input/output correspondence between the application program and the changed applicable devices. In similar fashion, in the case where the device driver corresponding to the changed device configuration cannot be set, the board packaging line coordinating computer uploads the device configuration after the change to the application server, so that the required device driver is retrieved by the application server based on the device configuration uploaded. Thus, the board packaging line coordinating computer may download the device driver retrieved from the application server and reset the device driver in each device.

With this configuration, the customer can change the device configuration covered by the application program within the scope of the contract.

In the invention, the service contract information further may include the effective period of the application program, and in the case where an application is to be executed, the board packaging coordinating computer may prohibit the execution of the particular application in other than the effective period.

In the invention, the board packaging line coordinating computer collects and stores the data on one or a plurality of items as the actually used data of the application program including the total execution time of the application program, the total standby time, the number of times a specific algorithm is operated, the number of times the operation result is displayed, the number of the boards processed and the number of specific boards extracted. With these actually used data individually or combined, the application server may carry out a variety of specific charge in accordance with predetermined charge conditions.

With this configuration, the charge operation record (the number of the boards processed, the number of times a specific algorithm is executed, the monitoring tie, the number of times the instruction for a specific job is issued, etc.) in the board packaging line prepared on the client machine can be collected assuredly by the server, who can conduct versatile charge operation based on the record.

In the invention, the execution of an application program may be prohibited, in the case where the service contract information includes the cycle period of transmitting the actually used data of the application program and updating the service contract information, and at least during this period, the actually used data of the application program is not transmitted or the service contract information is not updated, as the case may be, by the board packaging line coordinating computer.

Further, in the invention, the board packaging line coordinating computer may conduct internet communication with the application server through the communication client.

Next, considering the invention as a system, according to the invention, there is provided such a system for providing a board packaging line program, comprising various devices making up a board packaging line, a board packaging line coordinating computer connected with the devices through LAN, and an application server having stored therein an application program to be supplied to the board packaging line coordinating computer, the board packaging line coordinating computer and the application server being connected to each other through an internet.

In this system, the board packaging line coordinating computer includes means for downloading the service contract information prepared based on the contract signed with the customer and the application program stipulated in the service contract information from the application server, means for defining the board packaging line covered by the application program and the device configuration of the line based on the contract information and uploading the defined device configuration to the application server, and means for downloading the retrieved device driver from the application server and setting the retrieved device driver in each device. The application server, on the other hand, includes means for retrieving the required device driver from a group of the device drivers prepared, based on the device configuration uploaded from the board packaging line coordinating computer.

According to another aspect of the invention, there is provided a system for providing a board packaging line program, comprising a board packaging line coordinating computer connected by LAN with various devices making up a board packaging line, a communication client computer capable of transmitting information to and from the board packaging line coordinating computer through a removable medium, and an application server having stored therein an application program to be provided to the board packaging line coordinating computer, wherein the application server and the communication client computer are connected to each other through the internet.

In this system, the board packaging line coordinating computer includes means for downloading the service contract information prepared based on the contract signed with the customer and the application program stipulated in the service contract information, from the application server through a communication client and a removable medium, means for defining the board packaging line covered by the application program and the device configuration of the line based on the service contract information and uploading the defined device configuration to the application server through the communication client and the removable medium, and means for downloading the retrieved device driver from the application server through the communication client and the removable medium and setting the retrieved device driver in each device. The application server, on the other hand, includes means for retrieving the required device driver from a group of device drivers prepared, based on the device configuration uploaded from the board packaging line coordinating computer through the communication client and the removable medium.

With this configuration, the objects described above can be achieved even in the situation with the client machine installed in an environment where the internet cannot be connected.

According to still another aspect of the invention, there is provided a package defect source determining system for detecting a defect source of the board packaging line by transmitting and receiving the data between each device making up the board packaging line and the board packaging line coordinating computer through a network, wherein the devices include a device for mounting the parts, an inspection device for determining whether the result of the packaging process is conforming or non-conforming and a measuring device for measuring the information for determining a defect source. The measuring device is removably mounted on the board packaging line. The package defect source determining means built in the board packaging line coordinating computer has the function of identifying a defect source based on at least the information acquired from the measuring device. The "defect source" is defined not only as the cause of a defect but also the place where a defect has occurred and any other source from which more detailed information can be obtained based on the defect determination by the inspection device.

The board packaging line coordinating computer may have the function of activating the package defect source determining means upon receipt of a notice on the occurrence of a defect from any device making up the board packaging line.

According to yet another aspect of the invention, there is provided a package defect source determining method for a package defect source determining system to detect a defect source of the board packaging line by transmitting and receiving the data between each device making up the board packaging line and the board packaging line coordinating computer through a network, wherein the devices include at least a device for mounting the parts, an inspection device for determining whether the result of the packaging process is conforming or non-conforming, and a measuring device removably mounted on the board packaging line for measuring the information for determining a defect source. Then, the board packaging line is activated, and during the operation of the board packaging line, the board packaging line coordinating computer activates the defect source determining unit, and thereby specifies a defect source based on at least the information acquired from the measuring device. Further, the defect source determining unit may be activated upon receipt of a notice on the occurrence of a defect from the inspection device thereby to specify the defect source.

Furthermore, the board packaging line coordinating computer may acquire at least the information from the measuring device during the operation of the board packaging line, while at the same time storing the information in the measurement data storage means, which information is utilized to specify the defect source.

In the invention, the measuring device is removably mounted, and therefore, by employing an appropriate system configuration in accordance with the operating conditions of the board packaging line, a defect source can be specified with high accuracy while at the same time improving the production efficiency. Specifically, in the case where it is difficult to specify a defect source simply with the information from the inspection device mounted on the board packaging line, an appropriate measuring device is built in and the board packaging line is operated under the same conditions thereby to determine a defect source. In the case where the result of the defect source determination makes it possible to identify the cause of a defect, and the board packing line is adjusted to reduce the fraction defective, thereby reducing the necessity of the measuring device, a board packaging line may be constructed and operated with the measuring device removed therefrom.

In the defect source determining system and the defect source determining method described above, a removable measuring device and determining means, for example, may be added appropriately to an existing system including the mounting device, the inspection device and the coordinating computer. In this case, the added devices may be operated independently of the devices of the existing system.

As evident from the foregoing description, according to the invention, an application program in software form of the know-how about the board packaging line is supplied from a server, and operated on a client machine installed by the customer. At the same time, the client machine and the board packaging line are connected to each other through a network, so that the application program can collect the data real time from the devices of the board packaging line. Further, according to the invention, the latest, optimum application program and device driver can be supplied to the customer through the internet on the one hand and set up with the client automatically on the other. In addition, according to the invention, the measuring device is removably mounted, and therefore by employing an appropriate system configuration in accordance with the operating conditions of the board packaging line, a defect source can be specified with high accuracy.

BRIEF DESCRIPTION OF THE DRAWINGS

FIGS. 4A–4B is a diagram for explaining the data storage in the board packaging line coordinating computer.

FIGS. 10A–10C is a diagram for explaining the service setting information and service parameters.

FIG. 20 is a diagram for explaining the conventional method of providing an application service.

DESCRIPTION OF THE PREFERRED EMBODIMENTS

A method and system for providing a board packaging line program according to preferred embodiments of the invention are described below with reference to the accompanying drawings.

First, a general configuration of a system for implementing the method according to the invention, i.e. a system comprising a board packaging line, a board packaging line coordinating computer and an application server is explained. A system diagram of a network connecting the board packaging coordinating computer and the application server is shown in FIG. 1.

Figure 1:
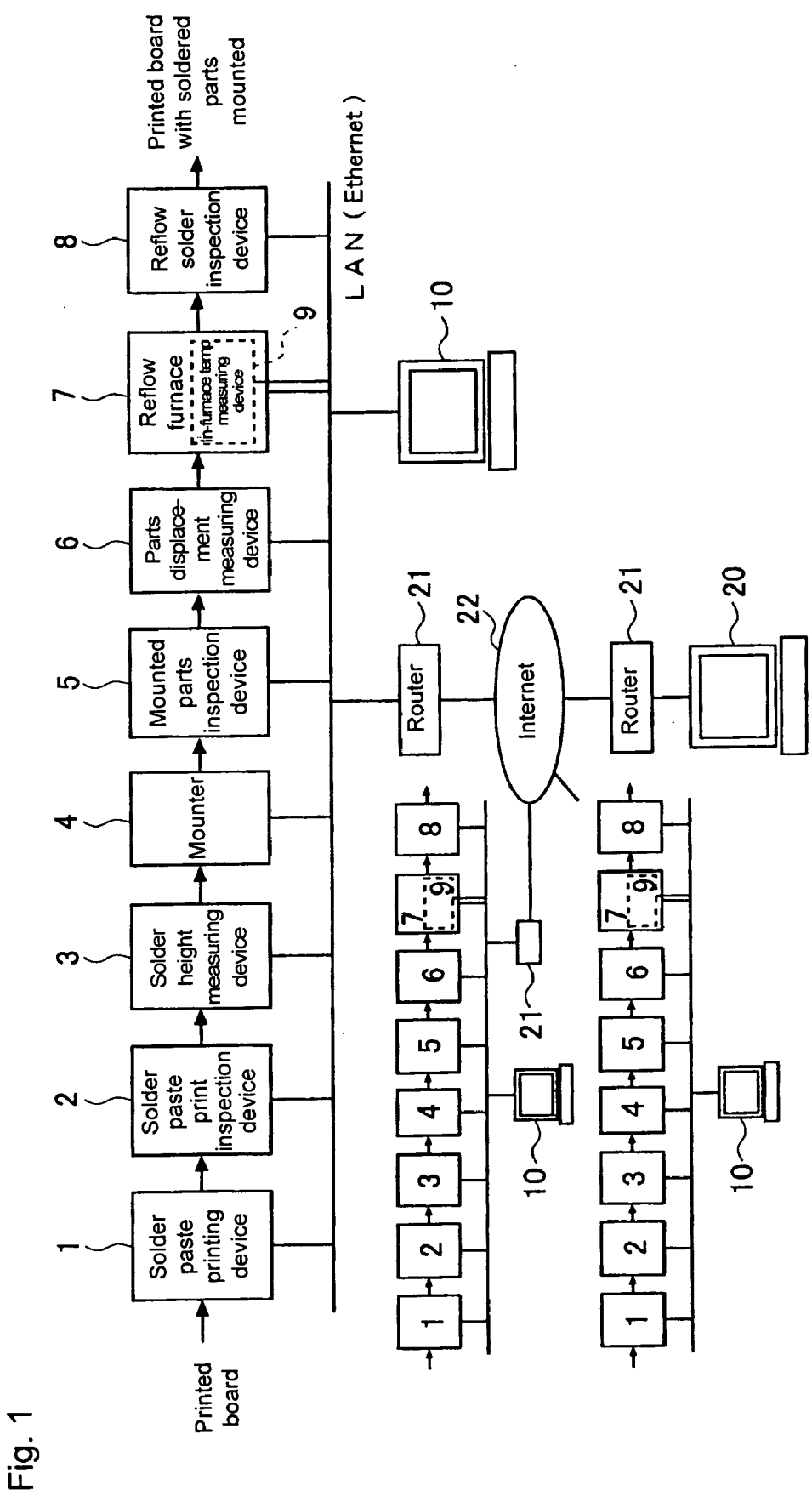
FIG. 1 is a system diagram showing a network for connecting a board packaging line coordinating computer and an application server.

As shown in FIG. 1, this system is configured of devices 1 to 9 making up a board packaging line, a board packaging line coordinating computer 10 connected to the devices 1 to 9 by LAN, and an application server 20 for storing an application program to be supplied to the board packaging line coordinating computer 10. All these devices and units are interconnected by an internet 22. Especially, in FIG. 1, three board packaging lines each including the devices 1 to 9 are connected to the application server 20 through the internet 22. In FIG. 1, reference numeral 21 designates a router.

Only one of the three board packaging lines is illustrated in detail. This board packaging line is configured by arranging, along the conveyance line, a solder paste printing device 1, a solder paste print inspection device 2, a solder height measuring device 3, a mounter 4, a mounted parts inspection device 5, a parts displacement measuring device 6, a reflow furnace 7 and a reflow solder inspection device 8. An in-furnace temperature measuring device 9 is mounted in the reflow furnace 7. Though not shown, the devices are connected to each other with a conveyor or the like transportation means. Along the conveyor, a printed board is sequentially passed through the devices while being processed as predetermined. In the last stage, a finished product with electronic parts mounted at predetermined positions and soldered on the printed board is obtained, and delivered out of the board packaging line. Further, the devices 1 to 9 are connected to a local area network (LAN), through which information are transmitted to and received from the board packaging line coordinating computer 10.

Of all the devices 1 to 9, the solder paste printing device 1, the mounter 4 and the reflow furnace 7 for executing a predetermined process on the printed board, and the solder paste print inspection device 2, the mounted parts inspection device 5 and the reflow solder inspection device 8 arranged in the subsequent stages, respectively, basically have a structure similar to those of the prior art.

A measuring device for measuring and collecting the data for making more detailed and more accurate determination than the inspection device is arranged in each of the last stages of the inspection devices 2, 5 and 8 and at other predetermined positions. These measuring devices include the solder height measuring device 3, the parts displacement measuring device 6 and the in-furnace temperature measuring device 9. Each measuring device is for acquiring information useful to specify the defective parts and the defect source, and makes measurement with higher accuracy than and measures the information not measured by the inspection devices.

Further, each measuring device is mounted removably. The measuring devices are mounted on the board packaging system, therefore, when the board packaging line is started, when a new product begins to be manufactured or otherwise when the data collection by the measuring devices is required. The information on the products processed through the steps for mounting the electronic parts on the printed board are collected, and based on the information on the products determined as defective by the inspection devices, a defect source and the like are identified. Further, based on the defect source thus identified, the operating conditions (including various parameters) for the devices (the solder paste printing device 1, the mounter 4 and the reflow furnace 7) for package production are determined automatically or manually and fed back to the system. In this way, a system is constructed with a lower fraction defective. Once the fraction defective is suppressed and a board packaging line with a predictably desired yield is constructed, the measuring devices are removed and defects are determined only by the normal inspection devices to continue the package production.

The expensive measuring devices, which are arranged in the system only for a predetermined period of time as described above, can be used on rotation among a plurality of board packaging lines. Thus, the cost increase of the board packaging line can be suppressed. The inspection devices are intended to detect defective parts. During the operation of the board packaging line, therefore, the inspection devices are required to be kept in operation to prevent defective parts from being delivered erroneously. Even during the operation of the board packaging line in steady state with the fraction defective reduced to lower than a target value, therefore, the inspection devices for determining whether parts are defective or not are essential. The measuring devices whose purpose is to specify a defect source, on the other hand, may be done without during the steady operation of the board packaging line. On the contrary, in view of the fact that the data acquired by the measuring devices can be effectively utilized upon occurrence of a defect, the data acquired by the measuring devices in the case where substantially no defect occurs are all wasteful. Not only is it undesirable to mount and operate the expensive measuring devices to collect a multiplicity of wasteful data from the viewpoint of production cost, but also as long as the data are being collected by the measuring devices, the products associated with the collection cannot be processed otherwise, thereby resulting in a lower production efficiency.

The measuring devices configured in removable form, as described above, can be mounted only when necessary to specify a defect source or the like. While the system is in steady operation, on the other hand, the measuring devices are removed. In this way, the productivity is improved. Nevertheless, the measuring devices may be kept mounted without any problem.

In another method of using and operating the measuring devices, the measuring devices are added to the board packaging line in the case where the data for specifying and determining a defect source cannot be obtained from the inspection devices, or the data, if obtained, are not sufficiently accurate. As far as the data required to determine a package defect source can be obtained from the manufacturing equipment or the inspection devices, the measuring devices are not of course required to be included in the system. Also, the entire set of the three measuring devices are not of course necessarily arranged but only one or two may be used.

Next, the devices 1 to 9 making up the board packaging line are described one by one. The solder paste printing device 1 applies the solder paste to a predetermined portion of the printed board conveyed in and sends the printed board to the solder paste print inspection device 2 in the next stage. The solder paste pint inspection device 2 inspects the solder paste applied by the solder paste printing device 1 to check to see whether a predetermined amount of solder paste is applied to a predetermined portion. This inspection is conducted by pattern matching between an image picked up from a part of the printed board and a reference pattern which is a normal printing pattern of the solder paste 1.

Regardless of whether the inspection result is conforming or non-conforming, the printed board is sent to the solder height measuring device 3 in the next stage where the solder height is measured. In the case where the inspection result is non-conforming, the printed board involved is removed from the transport line after measuring the solder height, and only those printed boards determined as conforming are sent to the mounter 4 in the next stage.

The solder height measuring device 3 three-dimensionally measures the solder paste applied on the printed board. Specifically, the solder height measuring device 3 has a one-dimensional height sensor, for example, and has the function of acquiring the height for one line in the direction transverse to the direction of transportation of the printed board. In this way, with the transportation of the printed board, the height for one line is acquired, so that the height of the surface of one printed board can be acquired, thereby making possible three-dimensional measurement. Further, since the three-dimensional profile of all the surfaces of the printed board can be measured, the comprehensive information can be acquired with high accuracy. The portion where the solder paste is applied is higher than the surface of the printed board. From the three-dimensional information, the position where the solder paste is applied and the pattern (two-dimensional information) and the height thereof can be measured with high accuracy. The inspection result (result of inspection as to conformity or non-conformity) of the solder paste print inspection device 2 and the solder height measuring device 3 are sent through the LAN to the board packaging line coordinating computer 10.

The mounter 4 is an automatic mounting device of electronic parts for mounting the electronic parts at predetermined positions on the printed board. The printed board with the electronic parts mounted thereon is sent to the mounted parts inspection device 5 in the next stage. In the mounted parts inspection device 5, it is determined whether the electronic parts mounted by the mounter 4 are in position and whether the type and model of the mounted parts are correct or not. Specifically, the image of the electronic parts mounted on the printed board is picked up using a CCD camera, for example, and the model number or the like printed on the surface of the parts is identified by character recognition. In this way, it is determined whether the right electronic parts are mounted in position or not.

The displacement between the actual position of the electronic parts mounted on the printed board and the ideal design position is measured by the parts displacement measuring device 6. Specifically, the mounted parts inspection device 5 determines whether the displacement of a given electronic part is not less than a threshold value or not, and in the case where it is not less than the threshold value, the particular part is determined as defective. The parts displacement amount measuring device 6 determines the actual amount of displacement by higher-accuracy measurement. Specifically, the image of an electronic part mounted on the printed board is picked up by the CCD camera or the like, and the position of the actually mounted electronic part by character recognition of the model number or the like printed on the surface of the part thereby to recognize the position of the electronic part. In this way, the difference with the right target mounting position of the particular part is calculated. Only those printed boards determined as free of defects by the mounted parts inspection device 5 are sent to the reflow furnace 7 through the parts displacement measuring device 6. The printed board determined as defective by inspection is removed from the transport line after measurement in the parts displacement measuring device 6. The result of inspection (determination of conformity or non-conformity) in the mounted parts inspection device 5 and the result of measurement in the parts displacement measuring device 6, regardless of whether conforming or non-conforming, are all sent to the board packaging line coordinating computer 10 through LAN.

The printed board with the electronic parts mounted thereon and the solder paste applied thereto is heated to an appropriate temperature in the reflow furnace 7. In this way, the solder paste is melted, and the electronic parts and the pattern on the printed board are connected to each other. The reflow furnace 7 has of course built therein a temperature sensor not shown, and based on the output of the temperature sensor, the internal temperature of the furnace is controlled.

The reflow solder inspection device 8 determines whether the electronic parts are correctly soldered on the printed board or not. In short, this inspection is to determine the conformity or non-conformity of the product as a whole as well as the soldered conditions. In the case where it is determined that a defect exists by the reflow solder inspection device 8, therefore, either the internal state (temperature or the like) of the reflow furnace 7 is unfavorable or the mounter 4 is has developed a malfunction. The in-furnace temperature measuring device 9 arranged in the reflow furnace 7 measures the temperature in the reflow furnace 7.

The result of this measurement and the result of inspection in the reflow solder inspection device 8 are sent to the board packaging line coordinating computer 10 through LAN. Only those printed boards that have been determined as conforming by the reflow solder inspection device 8 are delivered out of the board packaging line as a complete product through the conveyor. The printed boards that have been found defective by the inspection, on the other hand, are removed from the transport line and repaired or disposed of.

The board packaging line coordinating computer 10 is connected to the various devices 1 to 9 of the board packaging line through LAN, and upon receipt of a notice of a defect arriving from the board packaging line through LAN, executes the package defect source determining program and thereby automatically determines a package defect source. As described later, this package defect source determining program is downloaded from the application server 20.

According to this embodiment, the inspection result and the measurement result are applied real time to the board packaging line coordinating computer 10. In the process, which product is related to the information is registered. For example, a bar code or other ID information is attached to the printed board to be processed, and each device making up the board packaging line is equipped with a device (such as a bar code reader) to acquire the ID information. Based on the ID information such as the bar code, therefore, the result of inspection and the result of measurement can be easily related for the same printed board.

The inspection result and the measurement result for the same printed board can be related to each other not always with ID information. Specifically, each inspection device and each measuring device are informed of the number in order of a product (printed board) in process as counted from the start of the system operation. Therefore, the record information specifying the number in order is added to the inspection result and the measurement data and sent to the board packaging line coordinating computer 10.

In the case where all the printed boards are determined as conforming, the record information output from the inspection devices and the measuring devices are identical for all the printed boards of the same type. In the case where the data for a given type of printed board is required, therefore, the board packaging line coordinating computer 10 reads only the inspection result and the measurement data having the identical record information.

In the method of setting the record information described above, however, the record numbers attached to the inspection devices and the measuring devices for the same type of printed boards fail to coincide with each other in the case where a defective product occurs. According to this embodiment, however, the printed boards determined as defective by an inspection device are disposed of after passing through the measuring device paired with the particular inspection device. In other words, a printed board, once determined as defective by the solder paste print inspection device 2, is removed from the transport line after the solder height thereof is measured by the solder height measuring device 3. In similar fashion, once a product is determined as defective by the mounted parts inspection device 5, the particular product is removed from the transport line after the displacement amount thereof is measured by the parts displacement measuring device 6. Also, in the case where a product is determined as defective by the reflow solder inspection device 8, the particular product is removed directly from the transport line. Nevertheless, the in-furnace temperature of the printed board (product) to be removed from the transport line is measured by the in-furnace temperature measuring device 9 installed in the reflow furnace 7.

Assuming that a product proves to be defective, therefore, the record information of the inspection devices and the measuring devices attached subsequently to the same type of product take a value smaller by one order than the record information attached to the same inspection devices and the measuring devices before detection of the defect. Specifically, assume that the tenth printed board for which the package production is going on is determined as defective by the mounted parts inspection device 5. The tenth printed board is not sent to the reflow furnace 7. Once the 11th printed board is supplied to the package production system, the devices before and including the parts displacement measuring device 6 process the 11th printed board accompanied by the 11th record information, while the record information for the reflow solder inspection device 8 and the in-furnace temperature measuring device 9 concern the tenth printed board. The board packaging line coordinating computer 10, to which both the conforming and non-conforming inspection result are sent from the inspection devices, can easily recognize the record information for the same type of printed board and therefore can store the record information as related to the product type.

In this way, the inspection result and the measurement result are registered as related to the same type of printed board. In the case where a product is determined as defective by the reflow solder inspection device 8, for example, the measurement data acquired for the particular type of printed board, i.e. the measurement data obtained by the solder height measuring device 3, the parts displacement measuring device 6 and the in-furnace temperature measuring device 9 are extracted, and based on the measurement data, a defect source is identified. Specifically, according to this embodiment, the measurement data are registered as related to each type of printed board. Therefore, the conditions of each device of the actual package production system determined as defective based on the measurement data can be estimated, and the defect source can be specified easily and accurately. Once the defect source is specified, the board packaging line coordinating computer 10 determines the operating conditions of each device to eliminate the defect source, and sets the operating conditions in the solder paste printing device 1, the mounter 4 and the reflow furnace 7 through LAN.

By the registration of the measurement data as related to the printed board, the availability of the data for the same type of printed board is secured whenever required, and the measurement data is not necessarily required to be stored for each printed board. As an alternative configuration, the data collected for determining a defect combined with the inspection result are supplied to the board packaging line coordinating computer 10, and stored and held as related to each printed board together with the measurement data for use to specify a defect source.

Further, the invention is applicable of course to both the case in which the transport system is used for conveying the printed boards between the devices and the case in which such a transport system is not used (in what is called the cell production system having no transport system).

Figure 2:
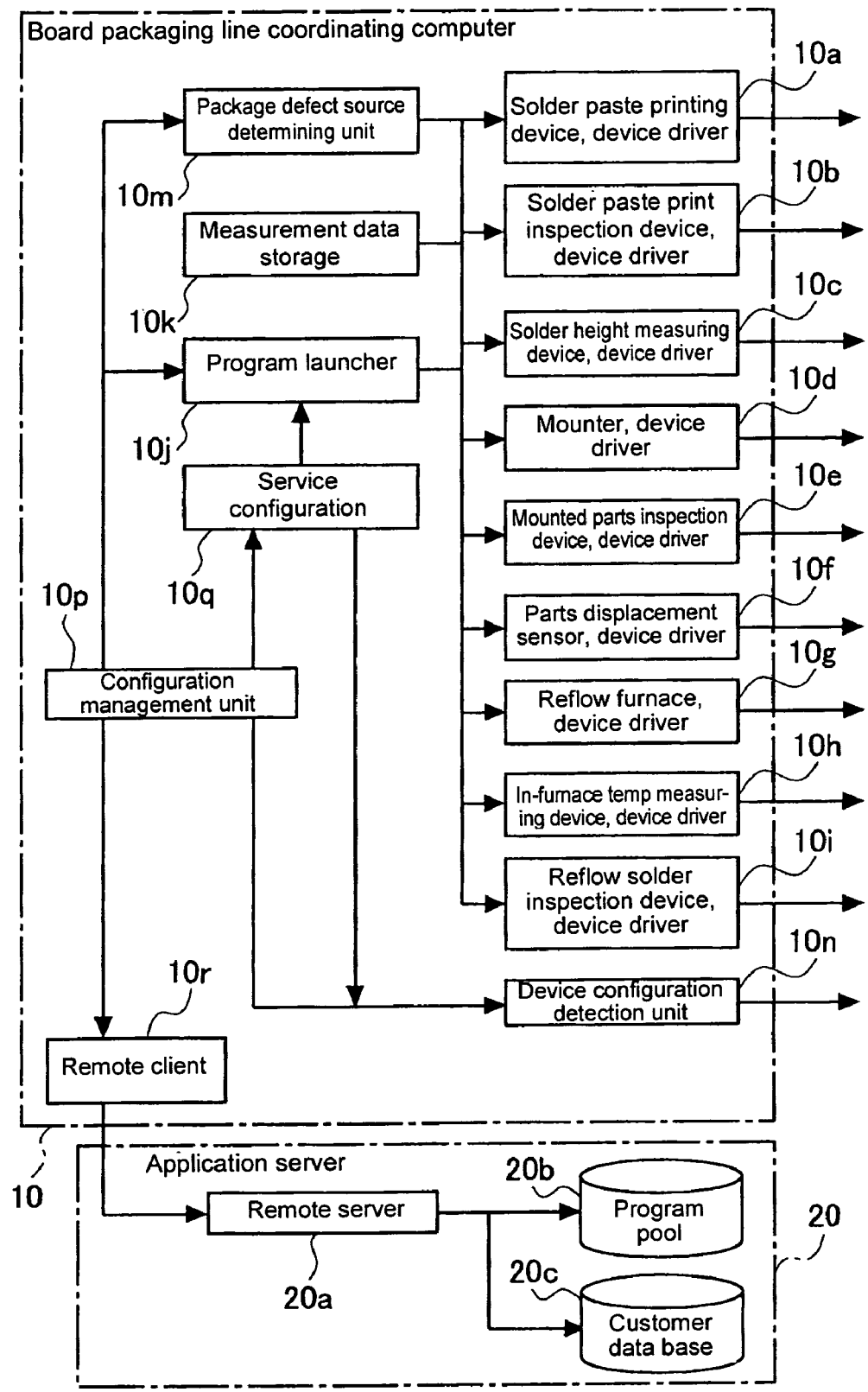
FIG. 2 is a functional block diagram for explaining the configuration of the board packaging line coordinating computer and the application server.
Figure 3:
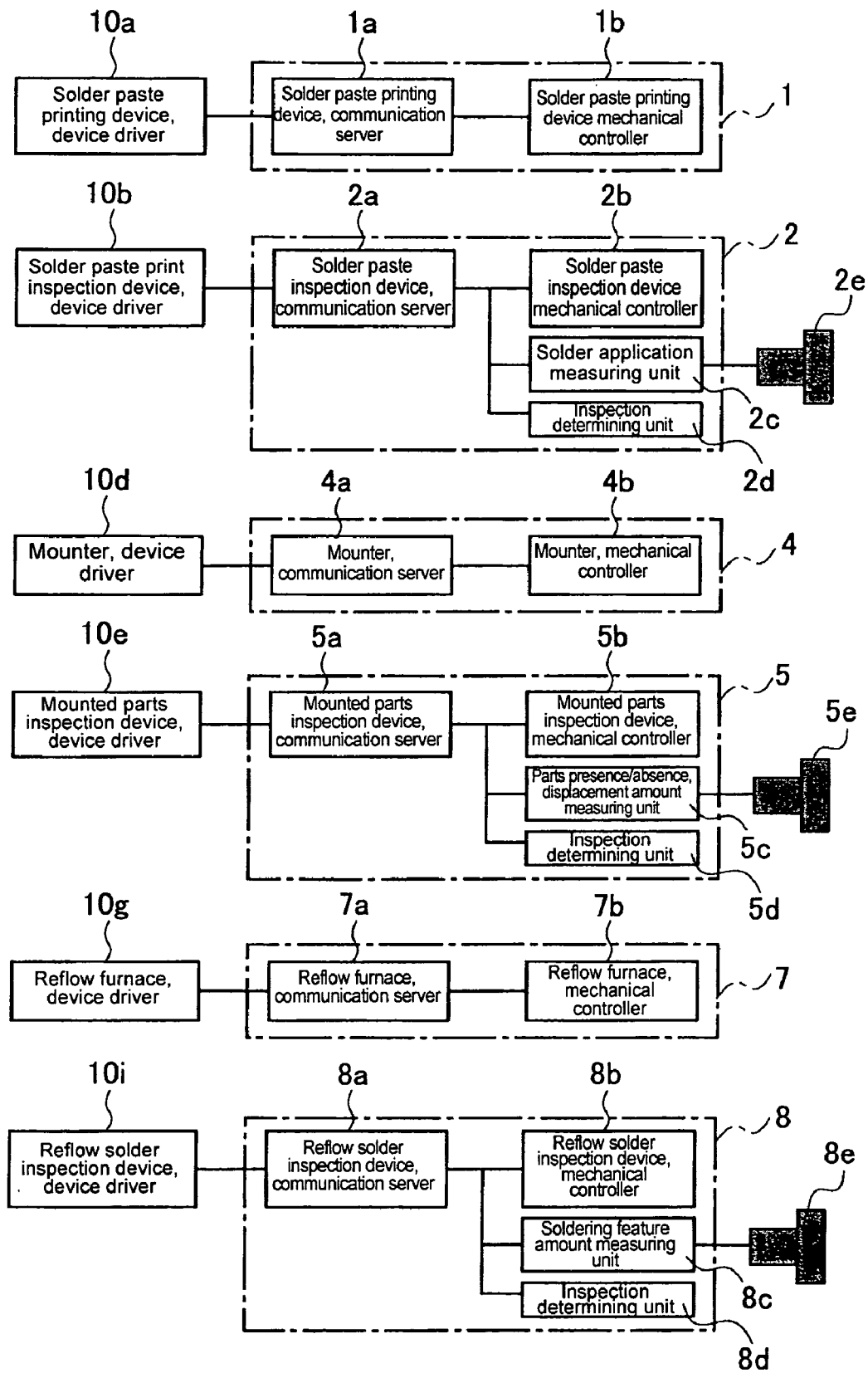
FIG. 3 is a functional block diagram for explaining the internal configuration of each device of the board packaging line.

Next, with reference to FIGS. 2 and 3, the internal configuration of the devices 1 to 9 is explained more specifically. A functional block diagram for explaining the configuration of a board packaging line coordinating computer and an application server is shown in FIG. 2, and a functional block diagram for explaining the internal configuration of each device on the board packaging line is shown in FIG. 3.

In FIGS. 2 and 3, the solder paste printing device 1 includes a solder paste printing device communication server 1a for transmitting the data to and receiving the data from the board packaging line coordinating computer 10, and a solder paste printing device mechanical controller 1b for controlling the operation of the solder paste printing device 1.

The solder paste printing device communication server 1a conducts the network communication, through LAN, with the device driver 10a of the solder paste printing device of the board packaging line coordinating computer 10, and thus carries out what is called the client-server communication in which the command processing request from the device driver 10a of the solder paste printing device is processed and the command processing result is returned to the device driver 10a of the solder paste printing device.

The solder paste printing device communication server 1a also has the function of transmitting an event message to the device driver 10a of the solder paste printing device 1 of the board packaging line coordinating computer 10 in order to notify the event occurred in the solder paste printing device 1. Examples of such an event include the one occurring steadily during normal operation, and a malfunction and an abnormal operation. The device driver 10a of the solder paste printing device 1 carries out a predetermined process for each event message received.

Examples of the command processing request output from the device driver 10a of the solder paste printing device 1 and the command processing result returned from the solder paste printing device communication server 1a in response to the command processing request are described below. Specifically, in response to the command processing request "read the device profile information", the "device profile information" held by the solder paste printing device 1 is read out and returned as a processing result. The command processing request "read the internal data of the device", on the other hand, contains the information designating which data in the device is to be read. Therefore, the "internal data of the device" so designated is read out, and returned as the processing result.

The device profile information includes such data as the "device name", the "production line name" and the "device instance name". The device name is the trade name of the device and includes the model and the name of the maker. The production line name, on the other hand, is the name of the production line making up the package production system associated with the device. The production line name is determined and registered in a device when the particular device is installed on the production line. The device instance name is the one for identifying a particular device on the production line.

The data designated by the command processing request to read the internal data of the device includes an "ID of the board being printed". This board ID is information for identifying the board on which the solder paste is being printed, and is the number attached uniquely to each board in the board packaging line. The board ID is implemented by the bar code, for example. Actually, the board ID is attached before the board is delivered into the board packaging line. Specifically, the board ID is printed on the board in the form of bar code, etc. This bar code is read by the bar code reader at the entrance of the board packaging line.

Some examples of the event message sent from the solder paste printing device communication serve 1a to the device driver 10a of the solder paste printing device include "the board job start event" sent out to the board at the start of the printing process and "the board job end event" sent out to the board upon completion of the printing process. In any case, the event message contains the board ID for identifying the printed board involved. There is also an "abnormality occurrence event" sent out, upon occurrence of an abnormality, together with an abnormality code to specify the contents of the particular abnormality.

This communication server of course is not limited to the functions described above but applicable to various functions depending on the maker and the model of the device. These functions are implemented by mounting the device driver corresponding to the communication server unique to the maker and the model on the board packaging line coordinating computer 10. Nevertheless, the functions of the communication server may be done without.

The solder paste printing device mechanical controller 1b is a control unit for implementing the original functions of the solder paste printing device 1, and is intended to control the conveyor in the solder paste printing device 1 or the solder paste supplier for applying the solder paste at a predetermined position on the printed board. The various devices in the solder paste printing device 1, which are similar to the corresponding conventional devices and are not directly related to the invention, are not described in detail.

The solder paste print inspection device 2 has built therein a solder paste print inspection device communication server 2a for conducting communication with the board packaging line coordinating computer 10, a solder paste print inspection device mechanical controller 2b for performing the original operation of the solder paste printing device 2, a solder application measuring device 2c and an inspection determining device 2d. The solder paste print inspection device 2 also includes an external CCD camera 2e connected to the solder application measuring device 2c.

The solder paste print inspection device mechanical controller 2b is for controlling the conveyor and illumination in the solder paste print inspection device 2. The various devices in the print inspection device and the control algorithm thereof are similar to those of the corresponding conventional devices and are not described in detail. The solder application measuring device 2c is for measuring the soldered position, the applied solder amount and the solder height based on the image data of the printed board picked up by the CCD camera 2e.

Specifically, the solder portion, as compared to the surface of the printed board (the area not coated with solder), has a higher reflectivity and brightness, and presents a metallic color such as silver, while the surface of the printed board is green or brown. From this feature or color difference, a predetermined image processing is performed to recognize the soldered area. Based on the soldered area thus recognized, the solder position and the applied solder amount can be determined.

As an example, the soldered position can be determined from the coordinate of the soldered area. In the case where the relative positions of the image pickup area of the CCD camera and the printed board are always the same, the coordinate can be determined by the X-Y coordinate values in the two-dimensional image data picked up. In the case where the relative positions of the image pickup area of the CCD camera and the printed board are not constant, on the other hand, the absolute coordinate value on the board can be determined based on a reference position constituting a target such as an edge of the printed board. Also, the amount of solder applied on the two-dimensional surface can be calculated by determining, for example, the area of soldered portion. The soldered position and the amount of solder applied can of course be determined also using other calculation algorithms.

The printed board is not necessarily be wholly accommodated in the image pickup area of the CCD camera 2e. In that case, the relative positions of the printed board and the CCD camera 2e are changed appropriately and an image is picked up a plurality of times to obtain the image data of the required portion. The only need is to determine whether a product is conforming or non-conforming, and therefore, the image of only a part of the printed board may be picked up. The measurement data obtained are held until the next board inspection is finished. The storage area for this purpose is secured in the inspection device.

Also, the solder height can be determined based on the image data sent from the CCD camera 2e. Specifically, a plurality of CCD cameras are prepared, and the solder height is calculated by determining the surface profile (height) by the stereoscopic image based on multiple (two) view points, or preparing a plurality of (say, three) light sources for radiation from different directions and determining the surface profile (height) utilizing the photometric stereo process with three light sources.

The inspection determining unit 2d determines the result of inspection of all the soldered areas and the pads on the board using the information obtained by measurement by the solder application measuring unit 2c. Various algorithms can be used for this determination, an example of which is described below.

Specifically, whether the applied solder amount is sufficient or not is determined by determining that a product is defective in the case where the solder area obtained by measurement is not more than a designated threshold value. The determination as to whether the soldered position is displaced or not is made, on the other hand, by determining that a product is defective in the case where the coordinate of the measured solder area and the coordinate of the designed pad area are separate from each other to a measure larger than a designated threshold value.

The displacement, on the other hand, is not necessarily determined by measuring the soldered position and calculating the amount of deviation from the design coordinate by the solder application measuring unit 2c. In an alternative method, the pattern form of the soldered area is acquired and matched with the normal pattern (reference pattern) so that the amount of displacement between corresponding patterns is determined. With regard to the applied solder amount, the pattern form of the soldered area is compared to the normal pattern, and it is determined whether the applied solder amount is correct or not from geometric analogy.

The solder paste print inspection device communication server 2a conducts the network communication with the device driver 10b of the solder paste print inspection device of the board packaging line coordinating computer 10, and executes the process in which the command processing request from the device driver 10b of the solder paste print inspection device is processed and the command processing result is returned to the device driver 10b of the solder paste print inspection device. The command processing request and the command processing result, like in the "command processing for the solder paste printing device" described above, includes the "device profile information read command" and the "the device internal data read command", and the processing result in response to the commands.

The device profile information read out is similar to that for the solder paste printing device 1 described above. The data designated by the request for processing the command to read the internal data of the device, in addition to the "ID of the board under inspection" specifying the printed board to be inspected, includes the determination result such as the "information on the inspection result of the last-inspected board" and the "information on the last-inspected soldered position". Further, the data also includes the "information on the last-inspected solder height" in the case where the solder application measuring unit has the function of determining the height of the surface of the printed board, i.e. the solder height.

The ID of the board under inspection is the information for identifying the board being inspected, as described above. In the case where the board ID is implemented by the bar code or the like, as in the solder paste printing device 1, the board ID recognized by the bar code reader or the like not shown is acquired and sent out.

The "information on the inspection result of the last-inspected board" is the information on the defect determination result of the last-inspected board. This inspection result contains the board ID and the determination result (conforming product or non-conforming product), and in the case of a non-conforming product, further contains the total number of defect causes determined and each defect cause determined. The defect cause determined includes the part ID of the defective part, the pad ID and the reason. The reason includes bleeding, solder shortage, displaced print, bridge or solder overage. The pad ID is the number for identifying the pad soldered with a part on the printed board on the board packaging line, and assigned the number unique to each pad in the part. The same pad ID is used on the board packaging line.

The "information on the last-inspected soldered position" is the information on all the soldered positions included in the board design and the corresponding soldered positions determined by an image picked up by the CCD camera 2e. Specifically, this information includes the board ID, the total number of the soldered position data and individual soldered position data. The soldered position data contains the design soldered position data for each position and the soldered position data actually measured. Further, the individual soldered position data contains the pad ID for specifying each position (pad area) and the coordinate data indicating the pad area.

As described above, according to this embodiment, not only it is determined whether a product is defective or not, but also the other information on the printed board are collected. This information is determined by the solder application measuring unit 2c and acquired and sent out by the communication server. The "information on the last-inspected solder height" is the three-dimensional data on the board surface. Specifically, this information contains an X pitch (the pitch in X-axis direction of the solder height data), a Y pitch (the pitch in Y-axis direction of the solder height data), the number of data measured in X direction, the number of data measured in Y direction and the solder height at each position.

According to the invention, the devices of any make or any model arranged on the board packaging line can be built in. For some makers or models of the inspection device, therefore, the measurement data described may not be obtained. In an extreme case, the only device function may be to output the result of determining whether a product is conforming or non-conforming. According to this embodiment, however, the measuring devices can be installed additionally, and therefore in the case where the data required for specifying a defect source cannot be obtained from the inspection device, the measuring device for acquiring the particular required data is added. With regard to the solder paste print inspection device 2, for example, this embodiment is such that since sufficient data cannot be obtained on the solder height by the inspection device, the solder height measuring device 3 is added. In other words, as long as the information obtained by the inspection devices is sufficient to determine a defect source, no measuring device is required.

The "data required to specify a defect source" is not necessarily limited to overage or shortage of the data types or items. Even in the case where the required data item is available, the required data may be lacking if the data accuracy is low.

Also, the event message sent out by the solder paste print inspection device communication server 2a to the device driver 10b of the solder paste print inspection device includes the "inspection start event" sent out to the board in the case where the inspection is started, and the "inspection end event" sent out to the board in the case where the inspection is finished. Both event messages contain the ID of the board for which the inspection is started or finished, as the case may be.

The solder height measuring device 3 obtains the solder height information by measurement on behalf of the solder paste print inspection device 2. By the term "on behalf of" is meant that the origin of the information for determining the defect source is changed. In other words, it means that the information used by the board packaging line coordinating computer 10 for defect determination is based on the information from the measuring devices. When the board packaging line is operated, the inspection devices are also of course operated to collect the required information. Also, part of the information output from the inspection devices may be replaced by the information obtained from the measuring devices. Specifically, in the case where the measuring devices are mounted, all the information used for determining a defect source are not derived from the measuring devices, but the defect source may be determined using the information from both the inspection devices and the measuring devices. The same relation holds true between the inspection devices and the measuring devices in the description that follows.

The information obtained from the measurement by the solder height measuring device 3 is determined by scanning the printed board using a one-dimensional height sensor. Specifically, a one-dimensional height sensor is prepared for scanning the printed board in the direction orthogonal to the direction of conveyance (transverse direction). As a result, the height information in the transverse direction at a given position of the printed board along the direction of conveyance (surface roughness information) can be obtained with high accuracy based on the sensor output.

Next, the printed board is moved by a predetermined distance along the direction of conveyance and stopped. Under this condition, the height information along the transverse direction of the printed board is acquired by the height sensor placed in opposed relation thereto. In this way, the printed board is conveyed by a predetermined distance each time to acquire the height information in transverse direction (direction orthogonal to the direction of conveyance), thereby acquiring the three-dimensional information on the whole surface of the printed board. By adjusting the distance over which the printed board is moved at a time, the three-dimensional information of a target accuracy can be obtained. According to this embodiment, the solder height is determined also by the solder paste print inspection device 2. The difference, however, lies in that the measurement by the solder height measuring device 3 is higher in accuracy and involves a greater number of measurement points. The data thus obtained are supplied to the solder height device driver 10c in the board packaging line coordinating computer 10 through LAN and fetched in by the particular board packaging line coordinating computer 10.

The mounter 4 includes a mounter communication server 4a and a mounter mechanical controller 4b. The mounter communication server 4a conducts network communication with the device driver 10d of the board packaging line coordinating computer 10, and executes the process in which the command processing request from the device driver 10d is processed, and the command processing result is returned to the device driver 10d. The specific command processing request and the specific command processing result are similar to those of the command processing for the solder paste printing device 1 described above. Also, the event message sent out by the communication server 4a to the communication driver 10d is similar to the "event message" for the solder paste printing device 1. The mounter mechanical controller 4b, which controls the conveyer and the mounting robot in the mounter 4 and has the well-known functions, is not directly related to the invention, and therefore is not described in detail.

The mounted parts inspection device 5 has built therein a mounted parts inspection device server 5a for communication with the board packaging line coordinating computer 10, a mounted part inspection device mechanical controller 5b for performing the original operation of the mounted part inspection device 5, a parts presence/absence and displacement amount measuring unit 5c and an inspection determining unit 5d on the one hand, and includes a CCD camera 5e connected externally to the parts presence/absence and displacement amount measuring unit 5c on the other hand.

The mounted parts inspection device controller 5b is for controlling the conveyor and the illumination in the mounted parts inspection device. The various devices in the print inspection device and the control algorithm thereof are similar to those of the prior art, and therefore are not described in detail.

The parts presence/absence and displacement amount measuring unit 5c obtains by measurement the information on the position of the mounted parts based on the two-dimensional image data picked up by the CCD camera 5e. This method of obtaining the mounted parts position information from the two-dimensional image data can employ an ordinary image processing algorithm. Specifically, which part is located at which position in the two-dimensional image data can be determined by image recognition and character recognition. Once the position on the actual printed board which corresponds to the origin (upper left, for example) in the two-dimensional image data determined, the corresponding position of the recognized part on the printed board can be calculated. The mounted part position information thus obtained is the position information of the part actually arranged on the printed board. Based on this position information of a given part, the presence or absence and the amount of displacement of the particular part can be measured. The mounted parts position information can of course be obtained by measurement using other image processing algorithms. The data obtained by measurement is held in store until the next board inspection is finished.

The inspection determining unit 5d makes a determination on all the parts on the printed board using the information obtained by measurement from the parts presence/absence and displacement amount measuring unit 5c. Specifically, the determination includes whether a designated part is mounted or not (a part is determined as defective in the case where the parts reference pattern coincidence rate is not more than a predetermined threshold level) and whether the mounting position is not displaced or not (a part is determined as defective in the case where the distance between the measured coordinate of the part area and the design coordinate of the part area is considerably greater than a predetermined threshold value).

The mounted parts inspection device communication server 5a, by the network communication with the device driver 10e of the mounted parts inspection device of the board packaging line coordinating computer 10, processes the command processing request from the device driver 10e of the mounted parts inspection device and returns the processing result to the device driver 10e of the mounted parts inspection device. The command processing request and the command processing result, like in the "command processing for the solder paste printing device", include the "ID of the board under inspection", the "information on the inspection result of the last-inspected board" and the "information on the position of the last-inspected mounted part", and the processing result corresponding to the command.

The "ID of the board under inspection" is the information for identifying the printed board now being inspected, as described above, and a unique number set for each printed board in the board packaging line. The "information on the inspection result of the last-inspected board", on the other hand, is the information on the result of defect determination of the last-inspected printed board, and includes the "conforming product or non-conforming product", and in the case where a part is determined as defective, further includes the reason for defect determination. The reason for defect determination includes the "part ID" and the "part displacement, part absence, part type error, polarity error, and the obverse and reverse sides opposite".

The "information on the position of the last-inspected mounted part" includes the positions of all the mounted parts on the package design, the steady mounted parts positions of which the image is picked by the CCD camera 5e, and the parts reference pattern coincidence rate. The event message sent out by the mounted parts inspection device communication server 5a to the device driver 10e of the mounted parts inspection device is the same as the "event message" sent by the solder paste print inspection device 2 explained above.

The parts displacement measuring device 6 makes more detailed measurement of the information on the mounted part position than the mounted parts inspection device 5, and through the network (LAN), transmits the measurement data to the board packaging line coordinating computer 10. Actually, the data are sent by communication with the device driver 10f of the parts displacement measuring device built in the board packaging line coordinating computer 10.

The information on the mounted parts position in the data that can be designated by the device internal data read command processing request is configured of the following information: "the mounted part position information" equivalent to the board ID combined with the number of the mounted part position data and the mounted part position data, "the mounted part position data" equivalent to the part ID combined with the ideal part position data and the measured part position, and "the part position data" equivalent to the rectangle center coordinate, the X-direction size and the Y-direction size. The data that can be obtained by measurement by the parts displacement measuring device 6 with higher accuracy than the mounted parts inspection device 5 include the rectangle center coordinate, X-direction size and the Y-direction size in the part position data obtained by measurement.

The reflow furnace 7 includes a reflow furnace communication server 7a and a reflow furnace mechanical controller 7b. The reflow furnace communication server 7a, by network communication with the device driver 10g of the reflow furnace of the board packaging line coordinating computer 10, executes the process in which the command processing request from the communication driver is processed and the command processing result is returned to the communication driver. The specific command processing request and the specific command processing result are similar to those of the command processing for the solder paste printing device 1 described above. Also, the event message sent out by the communication server to the communication driver is similar to the "event message" for the solder paste printing device 1.

The reflow furnace communication server 7a has the function of processing the command processing request from the device driver 10g and returning the command processing result to the device driver by the network communication with the device driver 10g of the reflow furnace of the board packaging line coordinating computer 10. Further, the reflow furnace communication server 7a transmits an event message on the event occurred in the reflow furnace 7, to the device driver 10g of the reflow furnace of the board packaging line coordinating computer 10. The reflow furnace device driver 10g that has received the event message executes the process predetermined for each event message.

The command processing request and the command processing result are the same as those of the "command processing for the solder paste printing device". The data designated by the device internal data read command processing request includes the "board ID" and the "temperature information in the reflow on the last-processed board". The "board ID" is the information for identifying the printed board being processed. The "temperature information in the reflow on the last-processed board" is the data on the in-furnace temperature change in the last-processed reflow temporally observed from the start to the end of reflow of the board.

The event message sent out by the reflow furnace communication server 7a to the reflow furnace device driver 10g is the same as the "event message" described with reference to the solder paste printing device 1. Also, the communication server is not limited to the configuration explained in this embodiment but may be unique to the maker or the device type, or free of the communication server. For the communication server unique to the maker or the device type, a communication driver is prepared in the board packaging line coordinating computer 10.

The reflow furnace mechanical controller 7b, which controls the conveyer and the heater in the reflow furnace 7 and has the well-known functions, is not directly related to the invention and therefore not described in detail.

The in-furnace temperature measuring device 9 obtains by measurement the temperature information (internal temperature) of the reflow furnace 7. Actually, the data is transmitted by communication with the device driver 10h of the in-furnace temperature measuring device built in the board packaging line coordinating computer 10. According to this embodiment, the reflow furnace 7 itself has the function of measuring the temperature and sending it to the board packaging line coordinating computer 10. The in-furnace temperature measuring device 9, however, regularly samples the temperature change from the start to the end of reflow of the printed board. This reflow furnace temperature information is configured of the "board ID combined with the number of temperature data and the temperature data". The data obtained by measurement are held until the reflow of the next board is finished. A storage area for this purpose is secured in the device.

The reflow solder inspection device 8 has built therein a reflow solder inspection device communication server 8a for communication with the board packaging line coordinating computer 10, a reflow solder inspection device mechanical controller 8b for performing the original operation of the reflow solder inspection device 8, a soldering feature amount measuring unit 8c and an inspection determining unit 8d on the one hand, and externally includes a CCD camera 8e connected to the soldering feature amount measuring unit 8c.

The reflow solder inspection device mechanical controller 8b is for controlling the conveyer and the illumination of the printed board in the reflow solder inspection device 8. The various devices in the reflow solder inspection device and the control algorithm thereof are similar to those of the prior art and therefore are not described in detail.

The soldering feature amount measuring unit 8c measures the soldering feature amount based on the two-dimensional image data picked up by the CCD camera 8e. This method of determining the soldering feature amount from the two-dimensional image data can employ an ordinary image processing algorithm. As an example, the solder portion is extracted by image recognition and the position and area thereof are determined, or which part is located at which position in the two-dimensional image data is determined by character recognition at the same time. Various feature amounts other than those listed above can of course be determined. The data obtained by measurement are held in store until the next board inspection is completed.

The inspection determining unit 8d is for determining as defective based on the feature amount obtained by the soldering feature amount measuring unit 8c. The conditions are determined for all the parts on the printed board and the pads. Specifically, it is determined whether the solder wettability is sufficient or not (a product is determined as defective in the case where the solder area considered a gentle slope from the feature amount is not more than a predetermined threshold value), whether the parts are correctly mounted or not (a product is determined as defective in the case where the parts reference pattern coincidence rate with the parts mounted portion is not more than a predetermined threshold value), etc.

The reflow solder inspection device communication server 8a, by the network communication with the device driver 10i of the reflow solder inspection device of the board packaging line coordinating compute 10, has the function of processing the command processing request from the device driver 10i and returning the command processing result to the device driver 10i. The command processing request and the command processing result are the same as those of the command processing for the solder paste printing device described above.

The data designated by the device internal data read command processing request includes the "ID of the board under inspection" and the "information on the inspection result of the last-inspected board". The "ID of the board under inspection", like in each inspection device described above, is the information for identifying the board now being inspected and a unique number set for each board in the board packaging line. In similar fashion, the "information on the inspection result of the last-inspected board", which is the information on the result of determining the last-inspected board as defective or not defective, includes whether a product is conforming or non-conforming, and in the case where the product is determined as defective, further includes the reason of determining as defective. The data structure of the "information on the inspection result of the last-inspected board", as in each of the inspection devices described above, includes the "determination result", the "total number of reasons for determining as defective" and the "reason for determining as defective". The event message sent by the reflow solder inspection device communication server 8a toward the device driver 10i of the reflow solder inspection device is similar to the corresponding message of the solder paste print result inspection device 2.

Next, mainly with reference to FIG. 2, the internal configuration of the board packaging line coordinating computer 10 is explained. As shown in FIG. 2, the coordinating computer 10 includes device drivers 10a to 10i for communication with the devices connected through LAN, a program launcher 10j, a measurement data storage 10k for holding the measurement data in store and a package defect source determining unit (implemented by software) 10m.

Each of the device drivers 10a to 10i accesses the communication server in the corresponding one of the devices 1 to 9, respectively, and upon receipt of a command processing request from other programs in the board packaging line coordinating computer 10, transfers the request to a predetermined device on the board packaging line and returns the command processing result to the program that has issued the command processing request. Further, the device drivers 10a to 10i keep monitoring the event message received from the devices 1 to 9, and upon receipt of event messages, transfers all of them to the program launcher 10j. A specific command, which was explained above with reference to the devices 1 to 9, is not described here.

Further, the device drivers 10a to 10i, as described later, downloads from the application server 20 and prepares the data corresponding to the communication server unique to the device maker or the device type. The device drivers 10a to 10i has the function to output an invalid value for the data required by the package defect source determining unit 10m in the case where the same data cannot be acquired from the communication server, and also the function to notify the program launcher 10j that the event is not supported in the case where the device related to the communication driver fails to support the event.

The measurement data storage 10k, which is a data base for recording the information on the printed boards in the board packaging line, acquires and stores the information sent from each device making up the board packaging line. An example of a specific data structure is shown in FIG. 4A. The total number (number of records) of the records in the data base is stored at the head of the structure, sequentially followed by storing the records (records 1 to n). The records are kept in one-to-one correspondence for each printed board, so that the information for the same printed board is stored in the same record. The board ID is used as a key for identifying the record. Specific information and items stored in the records are shown in FIG. 4B.

As apparent from FIG. 4B, the job start time and the job finish time for each device and the inspection result information, if any, are stored. The initial values of the start time and the finish time are invalid values, and the time information which may be acquired from each device is registered in a corresponding column. In the case where the job start time is an invalid value, therefore, it indicates that the particular job is not yet started, while in the case where the finish time is invalid, it indicates that the particular job is not yet finished.

Further, according to this embodiment, a plurality of columns are provided for the additional measuring device information. These columns are used in the case where a measuring device is added to the board packaging line and store an invalid value in the absence of an added measuring device. Specifically, according to this embodiment, although the solder height measuring device 3, the parts displacement measuring device 6 and the in-furnace temperature measuring device 9 are taken as examples of the additional measuring devices, the requirements can also be easily met for other measuring devices for measuring other data using the additional measuring device information of the records described above.

Furthermore, with regard to the solder height information, the mounted parts position information and the in-reflow furnace temperature information, the information obtained from the additional measuring devices, if any, are stored. Otherwise, an attempt is made to obtain the information from the manufacturing equipment and the inspection devices. The information, however, are not necessarily obtained from the manufacturing equipment and the inspection devices. In the case where the information cannot be obtained, an invalid value is stored.

According to this embodiment, all the additional measuring devices 3, 6 and 9 are provided, and therefore the information from the measuring devices are stored. In the case where the solder height measuring device 3 is not mounted and the solder height is measured also by the solder paste print inspection device 2, the solder height measured by the solder paste print inspection device 2 is stored. In the case where the solder height is not measured even by the solder paste print inspection device 2, on the other hand, an invalid value is stored. In this way, according to the invention, the information necessary for determining a package defect source is acquired in versatile way in accordance with the device configuration of the production line.

The data are stored in the measurement data storage 10*k* by the program launcher 10*j*. Specifically, the program launcher 10*j* acquires the event message issued from the devices 1 to 9, through the device drivers 10*a* to 10*i*, and executes the procedure predetermined for each event message. Specifically, the process described below is executed.

Once the board job start event is acquired from the solder paste printing device 1, the first step is to add the record to the measurement data storage 10*k* with the acquired board ID as a key. Then, the process is executed to store the solder paste printing job start time in the added record. In the case where the board job end event is acquired, on the other hand, the record is retrieved from the measurement data storage 10*k* with the board ID as a key, and the finish time of the solder paste printing job is stored in the record thus retrieved.

In the case where the board job start event is acquired from the solder paste print inspection device 2, on the other hand, the record is retrieved from the measurement data storage 10*k* with the board ID as a key, and the solder paste print inspection start time is stored in the record thus retrieved.

Figure 5:
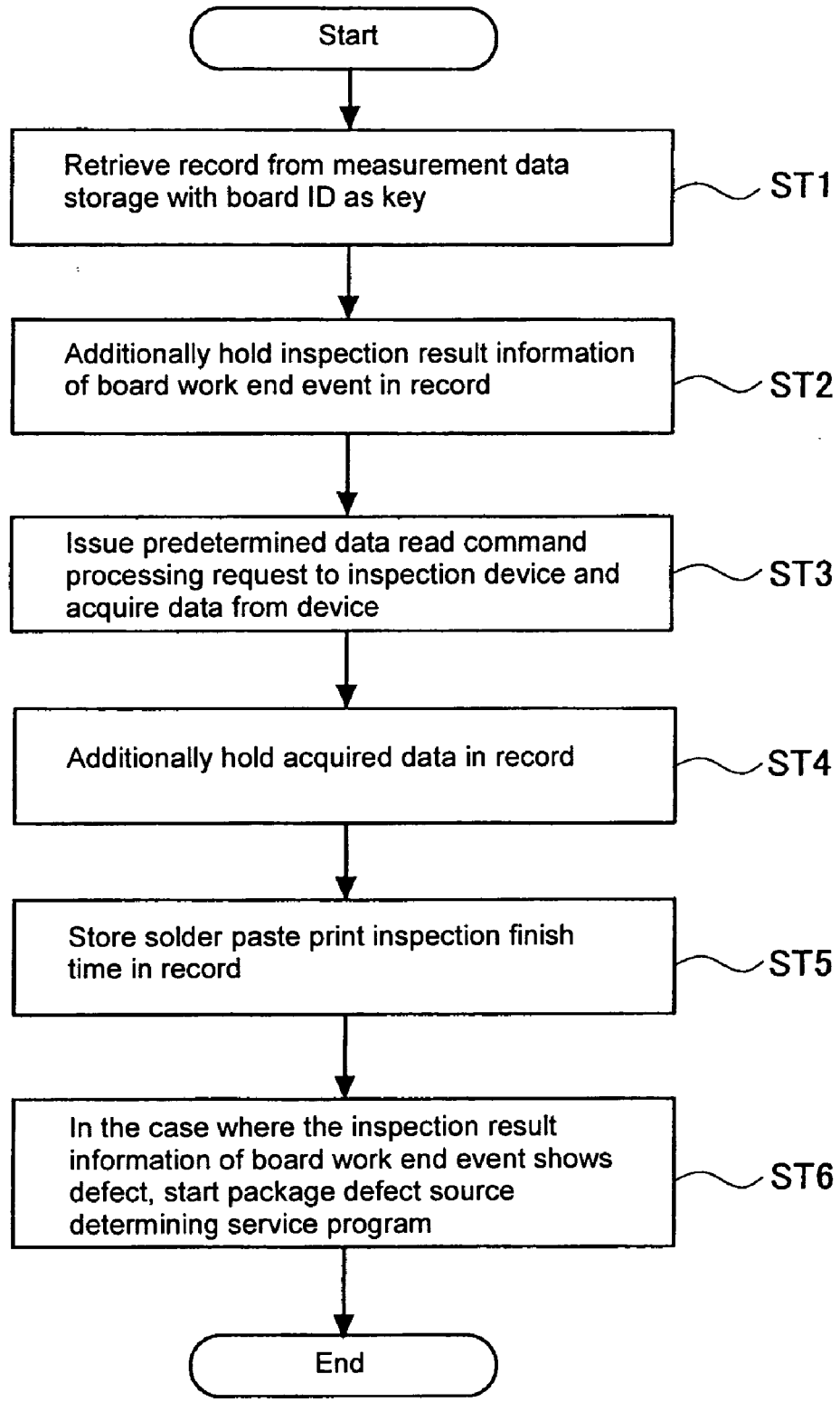
FIG. 5 is a flowchart for the job end event processing of a solder paste print inspection device.

In the case where the board job finish event is acquired, on the other hand, the process shown in the flowchart of FIG. 5 is executed. Specifically, the first step is to access the record from the measurement data storage 10*k* with the board ID as a key (ST1). The inspection result information of the board job finish event is added to and held in the record (ST2). Then, a command processing request for reading the data including the "information on the last-inspected soldered position" and the "information on the last-inspected solder height" is issued to the solder paste print inspection device 2, and the data is acquired from the solder paste print inspection device 2 (ST3). The data thus acquired is added to the record (ST4). Then, the solder paste print inspection finish time is stored in the record (ST5). After that, it is determined whether the information on the inspection result of the board job finish event is defective or not, and in the case where it is found to be defective, the package defect source determining service program is started (ST6). Specifically, the package defect source determining program is started to determine a defect source. In the case where the product is determined as conforming, on the other hand, the process is terminated. By starting the package defect source determining program, the function of the package defect source determining unit 10*m* is realized.

In the case where the board job start event is acquired from the mounter 4, the first step is to access the record from the measurement data storage 10*k* with the board ID as a key. Then, the part mounting job start time is stored in the record thus retrieved. In the case where the board job finish event is acquired, on the other hand, the record is retrieved from the measurement data storage 10*k* with the board ID as a key, and the part mounting job finish time is stored in the record thus retrieved.

Figure 6:
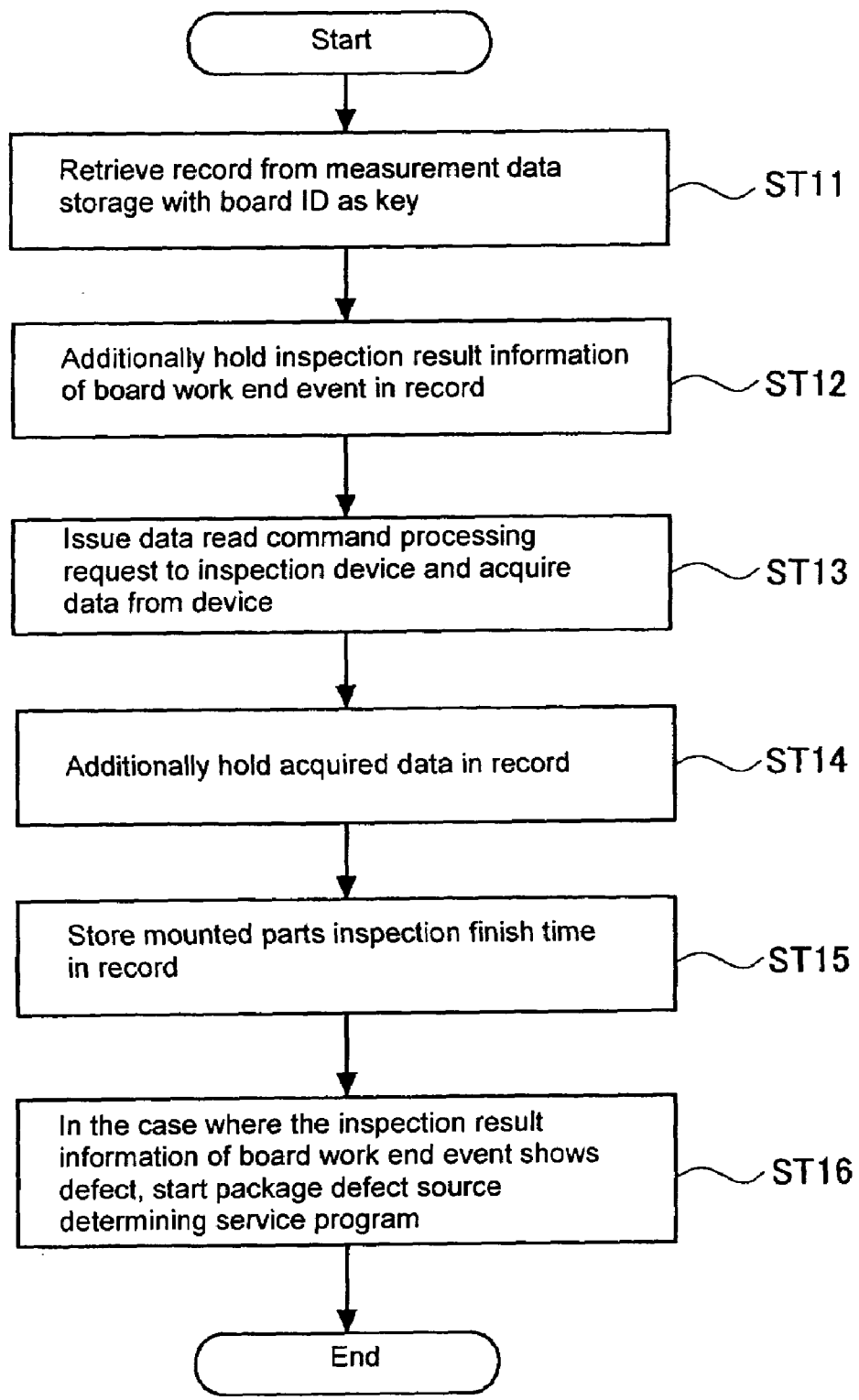
FIG. 6 is a flowchart showing the job end event processing of a mounted parts inspection device.

Once the board job start event is acquired from the mounted parts inspection device 5, the record is retrieved from the measurement data storage 10*k* with the board ID as a key, and the mounted parts inspection start time is stored in the record thus retrieved. Also, in the case where the board job finish event is acquired, the process shown in the flowchart of FIG. 6 is executed. Specifically, the first step is to access the record in the measurement storage 10*k* with the board ID as a key (ST11). Then, the information on the inspection result of the board job finish event is additionally stored in the record (ST12). Next, the data read command processing request is issued to the mounted parts inspection device 5 to read the "information on the last-inspected mounted part position", and the corresponding data is acquired from the mounted parts inspection device 5 (ST13). The data thus acquired is added to the record (ST14). Then, the mounted parts inspection finish time is stored in the record (ST15). It is determined whether the information on the inspection result of the board job finish event indicates a defect or not, and in the case where the particular information indicates a defect, the package defect source determining service program is started (ST16). Specifically, the package defect source determining program is started to determine a defect source. In the case where the product is conforming, on the other hand, the process is terminated. By starting the package defect source determining program, the function of the package defect source determining unit 10*m* is realized.

In the case where the board job start event is acquired from the reflow furnace 7, the first step is to access the record from the measurement data storage 10*k* with the board ID as a key. The reflow furnace start time is stored in the record thus retrieved.

Figure 7:
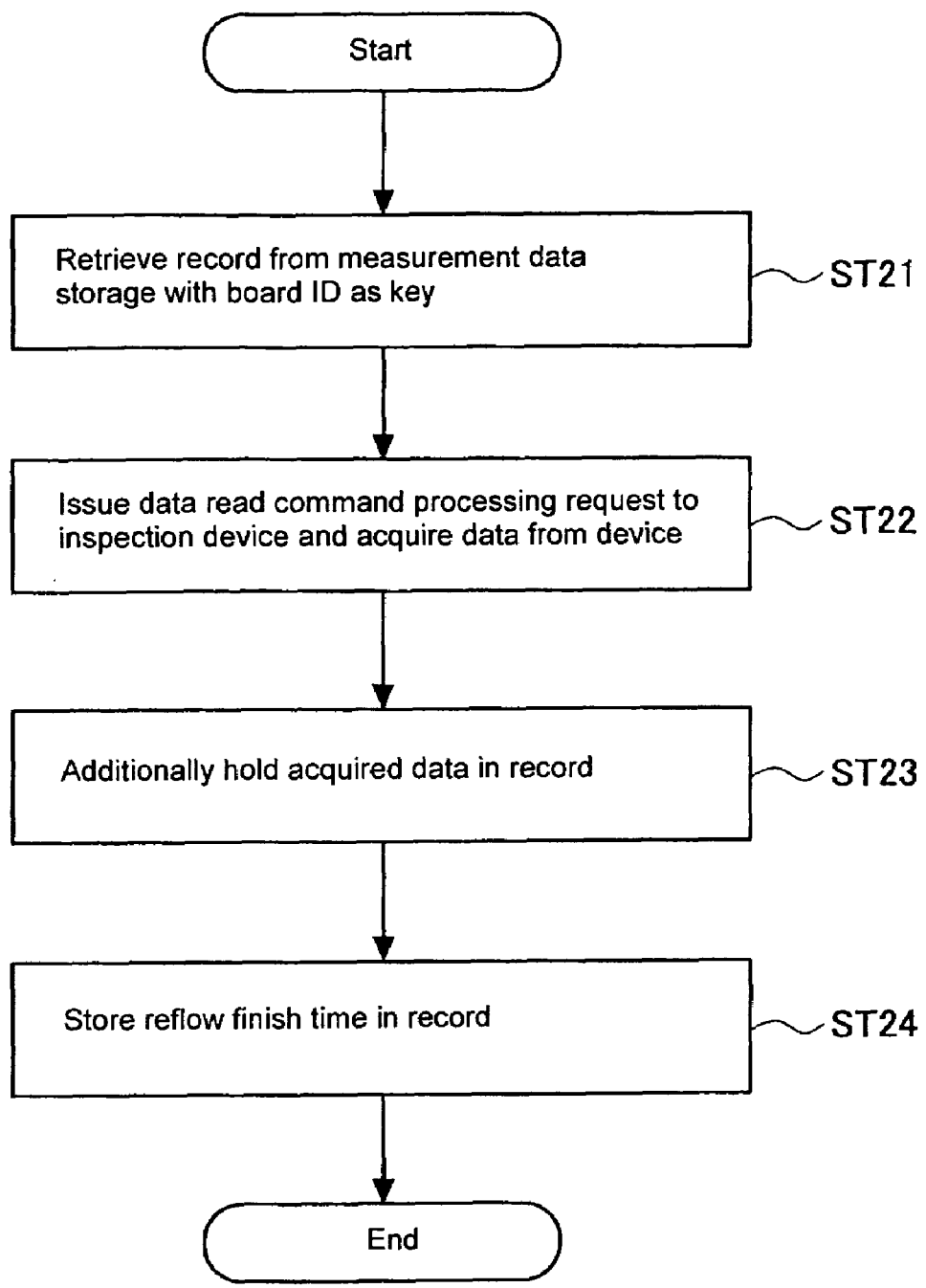
FIG. 7 is a flowchart showing the job end event processing of a reflow furnace.

Also, in the case where the board job finish event is acquired, the process shown in the flowchart of FIG. 7 is executed. Specifically, the first step is to retrieve the record from the measurement data storage 10*k* with the board ID as a key (ST21). Then, the data read command processing request to read the "temperature information in the last-inspected reflow" is issued to the device (in-furnace temperature measuring device 9), and the corresponding data is acquired from the in-furnace temperature measuring device 9 (ST22). The data thus acquired is added to the record (ST23). In the last step, the reflow finish time is stored in the record and the process is terminated (ST24).

In the case where the board job start event is acquired from the reflow solder inspection device 8, first, the record is retrieved from the measurement data storage 10k with the board ID as a key. The reflow solder inspection start time is stored in the record thus retrieved.

Figure 8:
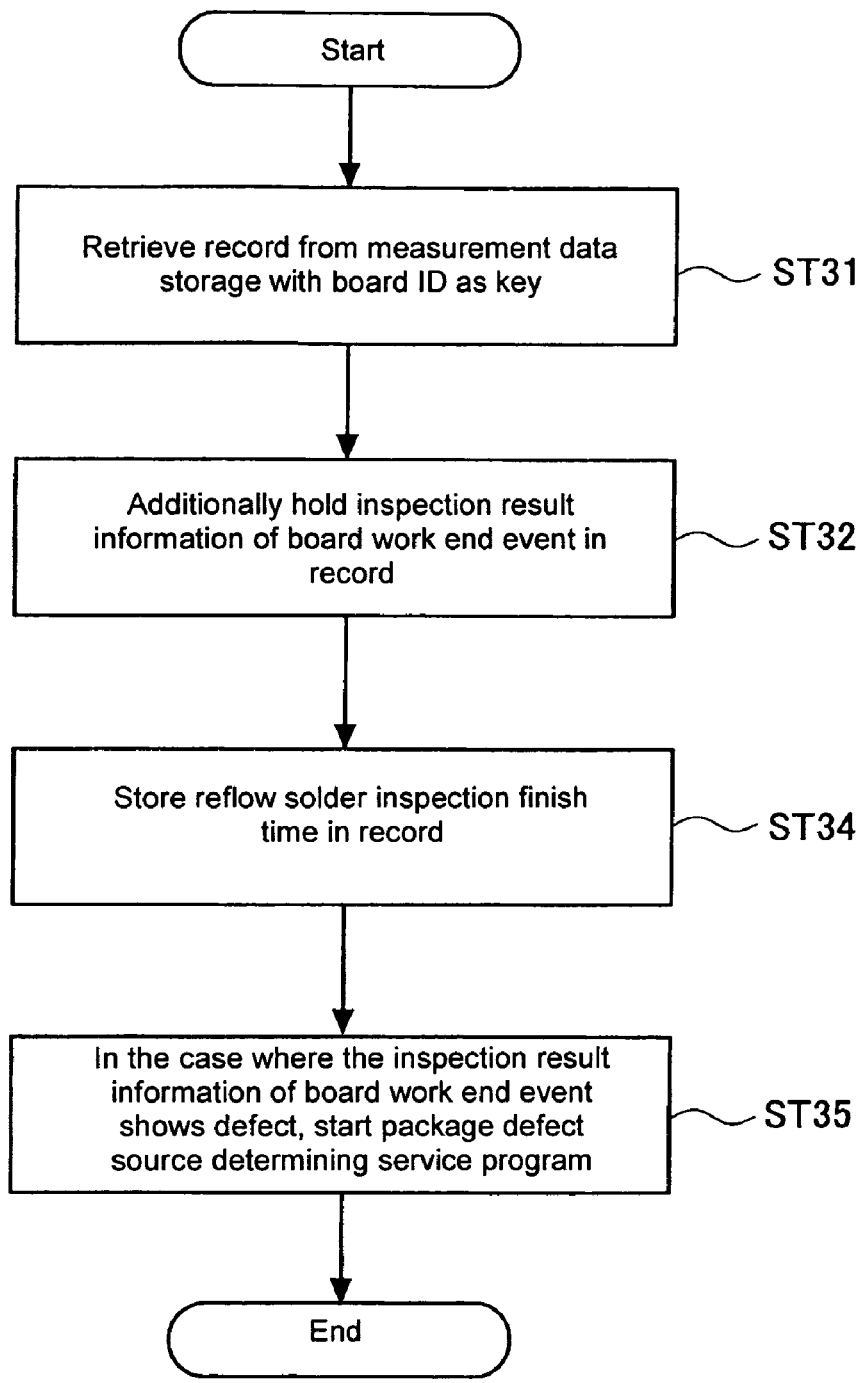
FIG. 8 is a flowchart showing the job end event processing of a reflow solder inspection device.

In the case where the board job finish event is acquired, on the other hand, the process shown in the flowchart of FIG. 8 is executed. Specifically, the first step is to retrieve the record from the measurement data storage 10k with the board ID as a key (ST31). Then, the information on the inspection result of the board job finish event is additionally stored in the record thus retrieved (ST32). Then, the reflow solder inspection finish time is stored in the record (ST34). It is determined whether the information on the inspection result of the board job finish event is conforming or not, and in the case where the information indicates a defect, the package defect source determining service program is started (ST35). Specifically, the package defect source determining program is started to determine a defect source. In the case where no defect is indicated by the information, on the other hand, the process is terminated. By starting the package defect source determining program, the function of the package defect source determining unit 10m is realized.

As described above, the provision of the program launcher 10j makes it possible to start the package defect source determining program on condition that the information indicates a defect, and a defect source is determined. In other words, in the case where the product is conforming, the package defect source determining program is not started, and the information sequentially acquired are stored in the measurement data storage 10k.

The event is not supported for some devices. According to this embodiment, however, the program launcher 10j executes the procedure in the form of driving the event, and therefore, the procedure related to an event is not simply executed. The procedure related to an event is a significant and independent process itself, and therefore, even if the particular process is not executed, the other processes are not affected.

Next, the structure of the package defect source determining program is explained. The package defect source determining program for implementing the package defect source determining unit 10m is started by the program launcher 10j in response to the determination that the board is defective, and contains the description about the determining algorithm for the package defect source determining service. This determining algorithm is realized by an ordinary inference algorithm used for the expert system, etc.

Some examples of the inference algorithm are: "in the case where the reason for defect determination is the chip rise (tomb-stone phenomenon) and the print amount applied on the pad is greatly varied, the solder paste printing device is a defect source", "in the case where the reason for defect determination is the tomb-stone phenomenon and the displacement amount of the mounted part position is large, the mounter is a defect source", "in the case where the reason for defect determination is the tomb-stone phenomenon and a large part is located nearby, the reflow furnace or the design is a defect source", "in the case where the reason for defect determination is the tomb-stone phenomenon and the solder paste is melted at high rate, the solder paste is a defect source", etc.

The reason for defect determination and the measurement amount required for evaluation on knowledge base are read appropriately from the measurement storage 10k by the package defect source determining unit 10m. Also, the data that can be obtained by processing the data in the measurement data storage 10k are appropriately processed and acquired by the package defect source determining unit 10m. Specifically, the "print amount applied on the pad" on knowledge base, for example, can be acquired by acquiring the pad area coordinate from the soldered position information and integrating the height data in the pad area from the solder height information.

Further, the knowledge base incorporates a threshold value and an evaluation function, which are compared in accordance with the description at the time of evaluation on knowledge base. A mounting example corresponding to "a great variation", for example, is that "the maximum print amount less the minimum print amount is larger than the print amount variation allowance" for the pad of the particular part.

The result of further analysis of the reason for defect determination notified from the inspection devices based on the data collected real time from the board packaging line is output from the package defect source determining unit 10m. This output is indicative of what problem exists where of the board packaging line. In the case where the measurement data contains an invalid value, the particular rule is ignored or, if evaluated, the significance is reduced in the evaluation with a predetermined constant. By doing so, a package defect source can be determined with a certain accuracy even in the case where an invalid value is contained.

Figure 9:
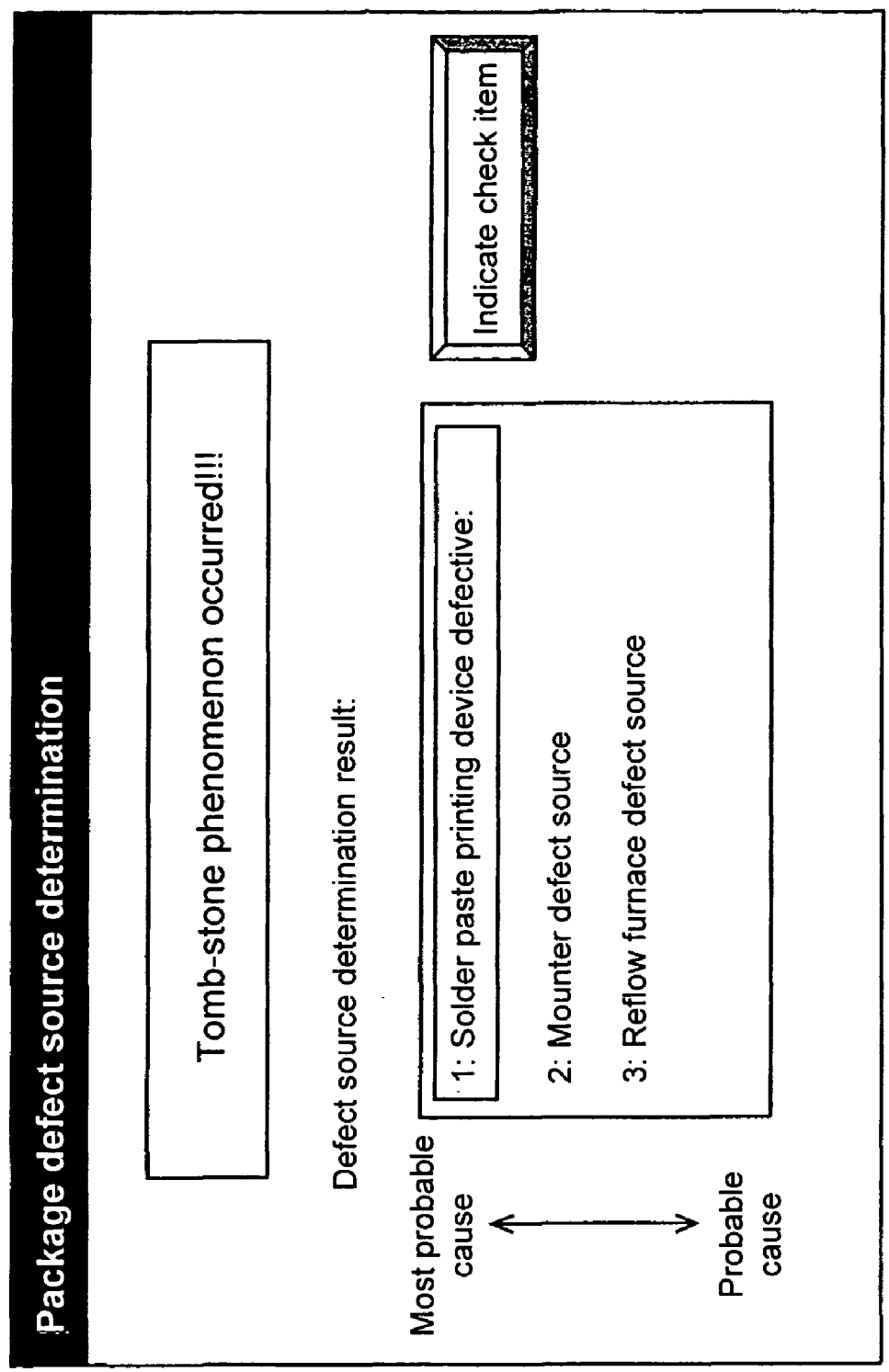
FIG. 9 is a diagram for explaining a screen showing an example of displaying the package defect source determining result.

The determination result of the package defect source determining unit 10m is output by being displayed on the computer screen or in such a manner that the information is added and stored in the measurement data storage 10k and at the end of the day or the like, the result of determination is displayed collectively. An example of display of the determination result on the computer screen is shown in FIG. 9. Examples of the contents of the determination result output from the package defect source determining unit 10m other than those illustrated include "the package design of the pad or the like is improper", "the solder paste mask is improper", "the jig is improper", "the part shape or plating is improper", "the solder paste is improper", "the soldering device is improper", "the mounter is improper" and "the reflow furnace is improper".

Various inference algorithms including the fuzzy inference algorithm and the forward search inference algorithm can be used. Also, the function of learning the knowledge base may be provided on the basis of the actual difference between the obtained measurement data and the determination result.

Next, the configuration of the device configuration detection unit 10n, the configuration management unit 10p, the service configuration 10q and the remote client 10r are explained.

The device configuration detection unit 10n regularly accesses the communication server of each of the devices 1 to 9 through LAN, and acquires the device profile information held by each device. According to this embodiment, this function is realized by taking advantage of the broardcast message function of the network (Ethernet (registered trade mark), for example).

The configuration management unit 10p checks to see whether the configuration of the device drivers 10a to 10n in the board packaging line coordinating computer 10 is coincident with the device configuration of the board packaging line or not. Specifically, the configuration of the device drivers 10a to 10n in the board packaging line coordinating computer 10 is known. Therefore, the device configuration of the board packaging line is acquired from the device configuration detection unit 10n, and both are compared to each other. In the case where they fail to coincide with each other, the configuration of the device drivers 10a to 10n is changed in such a manner as to attain the coincidence. As an alternative, the "package defect source determining program" for realizing the package defect source determining unit 10m in the board packaging line coordinating computer 10 and the drivers 10a to 10n are renewed to the latest version. The configuration management unit 10p specifically operates in such a manner as to realize the functions described below.

(1) Function of Automatic Addition of Device Driver

The device configuration detection unit 10n is accessed and the latest device configuration is acquired at a predetermined timing. The predetermined timing includes a regular interval of time, a time point designated in advance, or the time of starting the computer operation. The latest device configuration is compared to the configuration of the device drivers 10a to 10i, and in the case where a device not assigned the device driver is found, the application server 20 is accessed through the remote client 10r and the corresponding device driver is acquired. Then, the device driver newly acquired from the application server 20 is set up in the local computer.

(2) Automatic Renewal of Package Defect Source Determining Program and Device Driver A list of the latest versions of the programs and the device drivers currently operating in the board packaging line coordinating computer 10 is acquired from the application server 20 through the remote client 10r at a predetermined timing. The predetermined timing is similar to the like timing described above with reference to the function of automatic addition of communication drivers. A list of the latest versions is compared to the versions of the programs and the communication drivers currently operating in the board packaging line coordinating computer 10. In the case where the application server 20 has a new program or a new device driver, a corresponding program or communication driver, as the case may be, is acquired through the remote client 10r.

Next, the program launcher 10j is inquired as to whether the acquired software can be deleted or not, and the process stands by until the deletion becomes possible. Once the deletion becomes possible, the particular software operating in the computer is deleted, and the package defect source determining program and the communication driver newly acquired are set up in the local computer. The term "to set up" means that the program proper is stored in the auxiliary memory unit or the like in the local computer and the auxiliary memory unit instructs the program launcher 10j to start the program automatically.

In the case where the package defect source determining program is set up, the service configuration 10q is accessed. In acquiring the package defect source determining program, the "program proper" and the "service setting information" are acquired from the application server 20.

By the wording "the service setting information" is meant the information containing the description as to which device of the board packaging line the package defect source determining program works. This "service setting information", as shown in FIG. 10A, includes "the production line name", "the number of devices" and "the device designating information". The "production line name" is the name of the board packaging line to be operated by the particular software, and written by the application server 20. The "number of devices" is the total (maximum) number of the devices desirably to be operated in accordance with the package defect source determining program. The "device designating information" is a list of only the devices desirably to be operated in accordance with the package defect source determining program. The "device designating information", as shown in FIG. 10B, is a table in which the "device type", the "device name" and the "device instance name" are related to each other, of which the "device type" is always designated.

The "service setting information" is supplied from the application server 20. The information supplied from the server 20, however, lacks a portion of the contents. This portion is written by the service configuration 10q to complete the "service parameters". The "service parameters" are read at the time of starting the package defect source determining program and reflected in the program operation. The "service parameters" specifically have a data structure as shown in FIG. 10C. The "production line name" has the same contents as the "service setting information", which is the information for specifying the board packaging line to be used.

Other data include the "device designating information" with the device instance name embedded therein based on the result of device configuration detection of the production line. In the case where the related device is lacking or it is not desired that the package defect source determining program works, the "no device" is set as a device type of the "device designating information". The service parameters are read at the time of starting the package defect source determining program and reflected in the program operation.

The service configuration 10q automatically sets which device is worked on by the package defect source determining program downloaded and set up, based on the "the service setting information" acquired from the application server 20 and the "device profile information" acquired from the actual board packaging line. Specifically, the service configuration 10q has the functions described below.

(1) In the case where there exist a plurality of board packaging lines on a single network (LAN), the package defect source determining program is caused to work on the devices on the same line. Which board packaging line is operated in accordance with the package defect source determining program is defined in the "service setting information". Therefore, this "service setting information" is recognized, and based on this recognition, the board packaging line is set.

(2) In the case where the device configuration from one board packaging line to another, the package defect source determining program is changed in keeping with the reality of the board packaging lines.

(3) For some board packaging lines, the package defect source determining program may be limited to some devices excepting a given device, if existent on the line. In such a case, the parameters applied to the package defect source determining program are changed in accordance with the reality of the board packaging line. The parameter change described above and a particular device involved are defined in the "service setting information".

Figure 11:
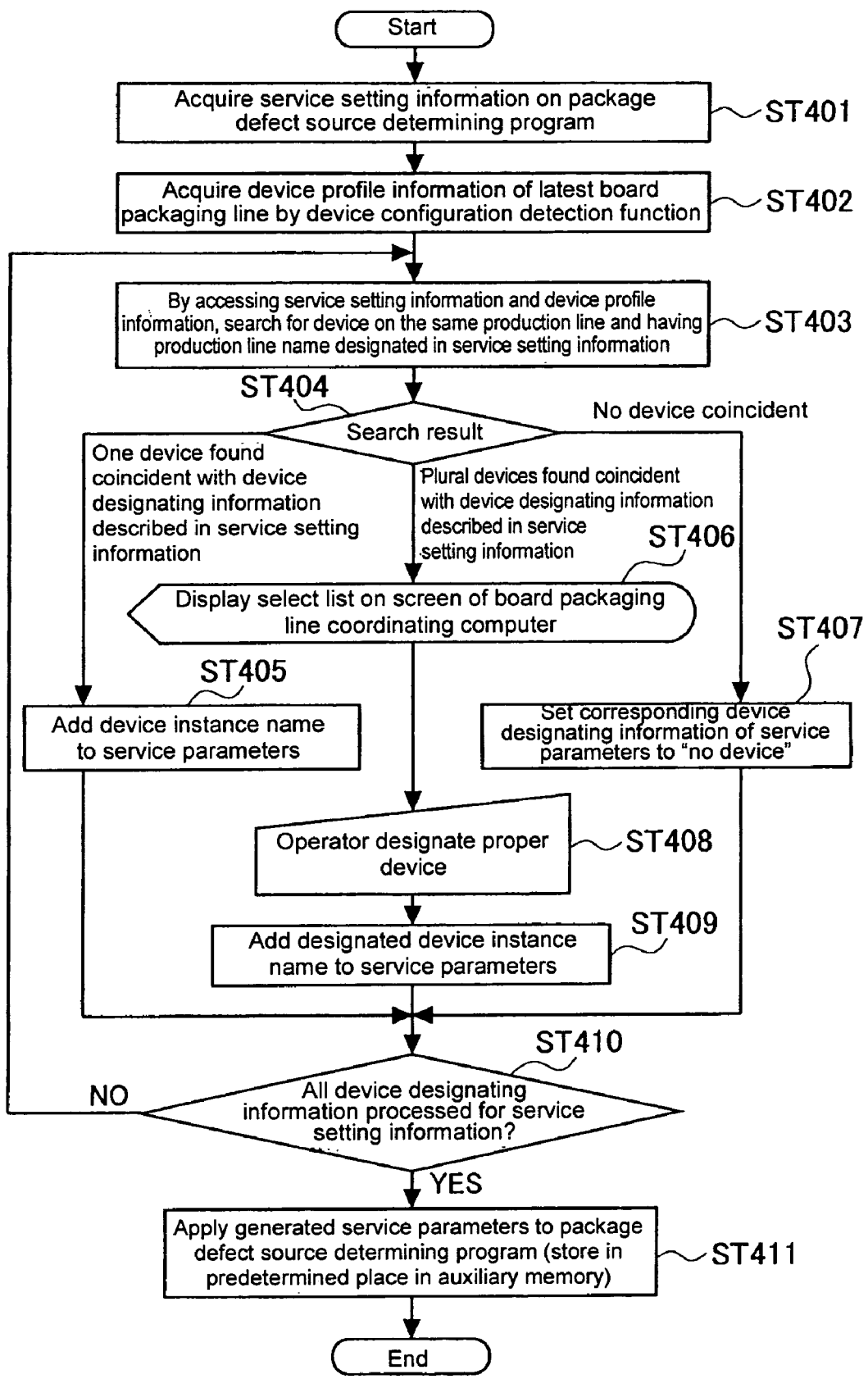
FIG. 11 is a flowchart showing the operation of a service configuration.

The function of the service configuration 10q described above is realized by executing the process shown in the flowchart (ST401 to 411) of FIG. 11. Specifically, first, the "service setting information" for the package defect source determining program is acquired (step ST401). Then, the "device profile information" of the latest board packaging line is acquired by the device configuration detection function (step ST402). Then, the device of "the production line name" on the same line and designated in the "service setting information" is retrieved by accessing the "service setting information" and the "device profile information" (step ST403). Then, the retrieval result is determined (step ST404). In the case where the result of retrieval shows that there is only one device coincident with the "device designating information" described in the "service setting information", the instance name of the particular device is added to the service parameters (step ST405). In the case where the retrieval result shows that a plurality of devices are coincident with the device designating information described in the "service setting information", on the other hand, a select list is displayed on the screen of the board packaging line coordinating computer 10 (step ST406). Then, the operator is prompted to designate the proper device (step ST408), and the instance name of the designated device is added to the "service parameters" (step ST409). In the case where the retrieval result shows that there is no device coincident with the device designating information, the device designating information of the "service parameters" is set to "Nil" (step ST407). This process (steps ST403 to 409) is repeated until the entire process for the device designating information of the "service setting information" is complete ("NO" in step ST410), and upon completion of the process ("YES" in step ST410), the generated "service parameters" are applied to the package defect source determining program (stored at a predetermined place of the auxiliary memory unit).

The remote client 10r is retrieved from the various functions in the board packaging line coordinating computer 10, the command processing request is transmitted to the application server 20, and the command processing result is acquired from the application server and returned to the origin. A main command processing request is the "download software", for example. Through this command processing request, the communication driver of the designated device and the package defect source determining program can be acquired from the application server 20.

Next, the configuration of the application server is explained. As shown in FIG. 2, the application server 20 includes a remote server 20a, a program pool 20b and a customer data base 20c.

The remote server 20a is accessed from the remote client 10r in the board packaging line coordinating computer 10 through the internet. The received command processing request is processed and the processing result is returned to the remote client 10r. The main command request received as related to the invention is the "download software", and upon receipt of this request, the processing steps described below are executed.

In the first processing step, the driver of the device name designated by the command processing request or the package defect source determining program ("program proper" and "service setting information model") is acquired from the program pool 20b. In the next second processing step, the customer data base 20c is searched with the transmitter of the command processing request as a key, and the contract information is acquired. In the next third processing step, the "service setting information model" obtained from the contract information in the first processing step is rewritten. In the next fourth processing step, the "program proper" and the rewritten "service setting information" are returned as a processing result.

Figure 12A:
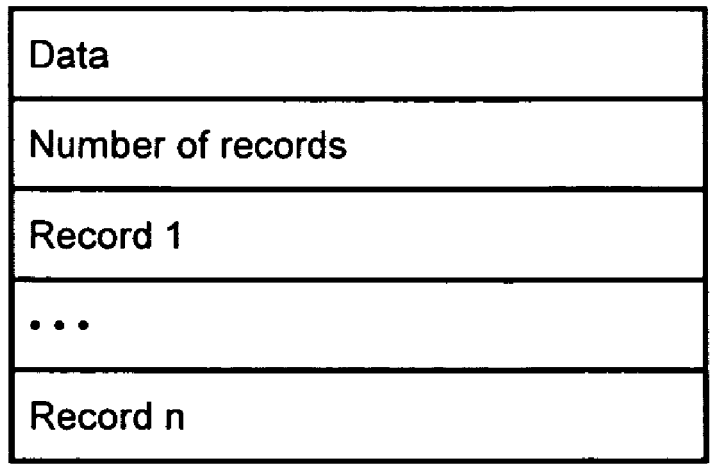
FIGS. 12A–12B is a diagram for explaining a program pool in the application server.
Figure 12B:
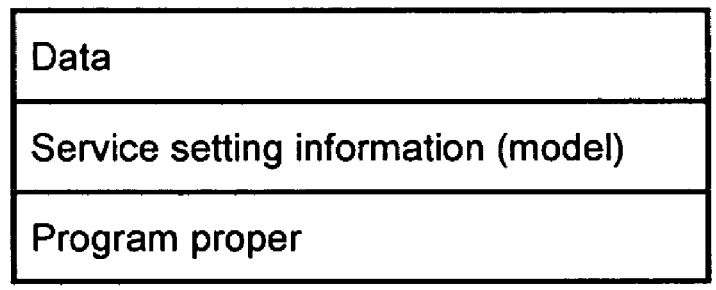

The program pool 20b is a data base for storing and holding the "program proper" and the "service setting information model" as one record. The data structure, as shown in FIG. 12A, is such that the "number of records" constituting the total number of records in the data base and the specific contents of the records are stored. Each record (1 to n) is associated with one program corresponding to one function such as one package defect source determining program or one communication driver. As shown in FIG. 12B, each record includes the service setting information model and the program proper. The program proper is that for the package defect source determining program or the communication driver.

Figure 13A:
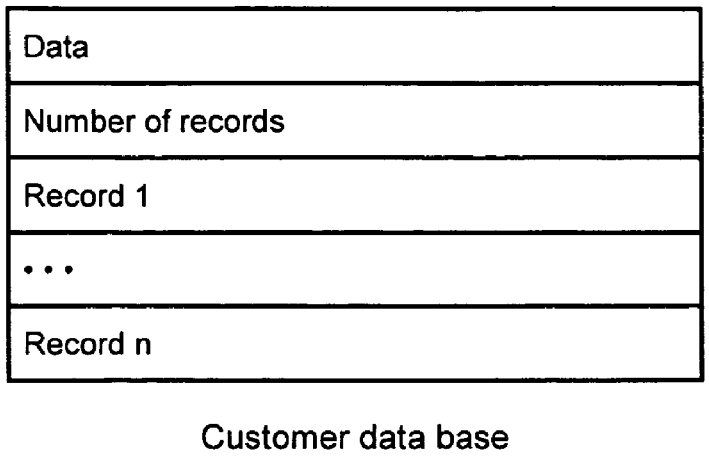
FIGS. 13A–13C is a diagram for explaining the customer data base in the application server.
Figure 13B:
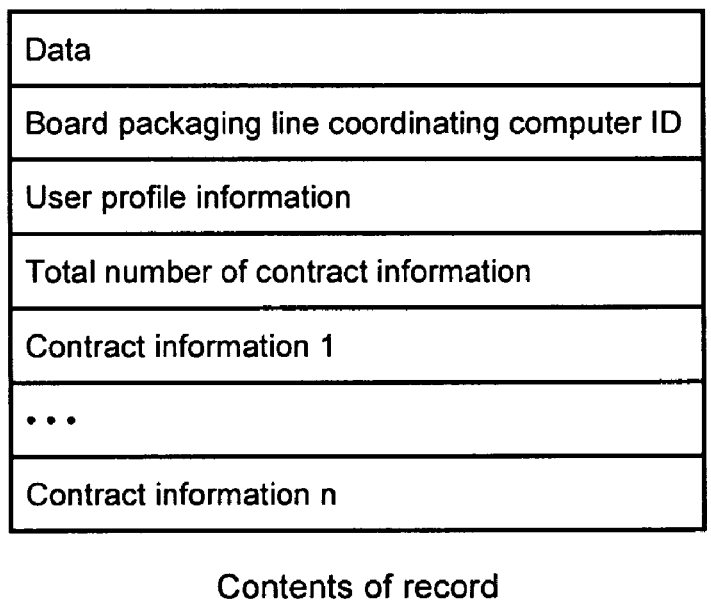
Figure 13C:
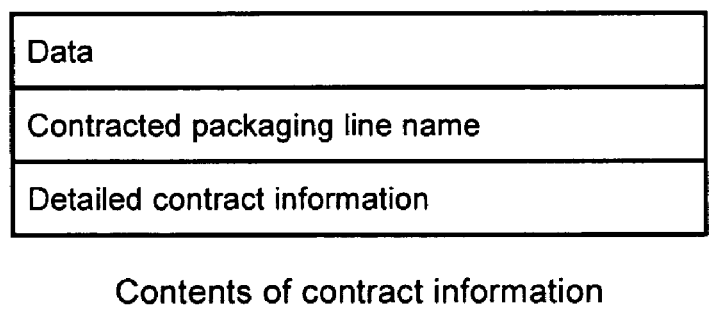

The customer data base 20c is the one for storing the information unique to each board packaging line coordinating computer 10 or the specifics of the contract. Specifically, a data structure as shown in FIG. 13 is employed. More specifically, as shown in FIG. 13A, the "number of records" constituting the total number of records in the data base and the specific contents of the records (records 1 to n) are stored. Each record (1 to n) corresponds to one board packaging line coordinating computer. Each record (record 1 to n), as shown in FIG. 13B, has stored therein the "board packaging line coordinating computer ID" for identifying the board packaging line coordinating computer 10, the "user profile information" for the particular computer, the "total number of the contract information" constituting the total number of the contract information, and the specific "contract information". The "user profile information" is for specifying the customer, which is the user name, for example. The "contract information" (contract information 1 to n), as shown in FIG. 13C, include the "contracted packaging line name" specifying the production line name covered by the contract and the "detailed contract information" for recording the device types excepted and the like.

In the case where a request to download the software from the remote client 10r, these "contract information" are checked to confirm who is the board packaging line coordinating computer (remote client 10r) that has issued the request, and based on the corresponding "contract information", the "service setting information" is changed. In this way, while sharing the basic program, the package defect source determining programs and the communication drivers suitable for the board packaging lines for different device configurations, different equipments used and different objects of production can be provided. In the case where the configuration is different to a large measure, the program proper is also of course different. For the system configurations basically identical or analogous to such an extent as to be met by changing a parameter, however, the same program proper is applicable.

The form in which the application server 20 and the board packaging line coordinating computer 10 are connected to each other is shown in FIG. 14. As shown in FIG. 14, the application server 20 and the board packaging line coordinating computer 10 are connected to each other in one of two forms.

Figure 14A:
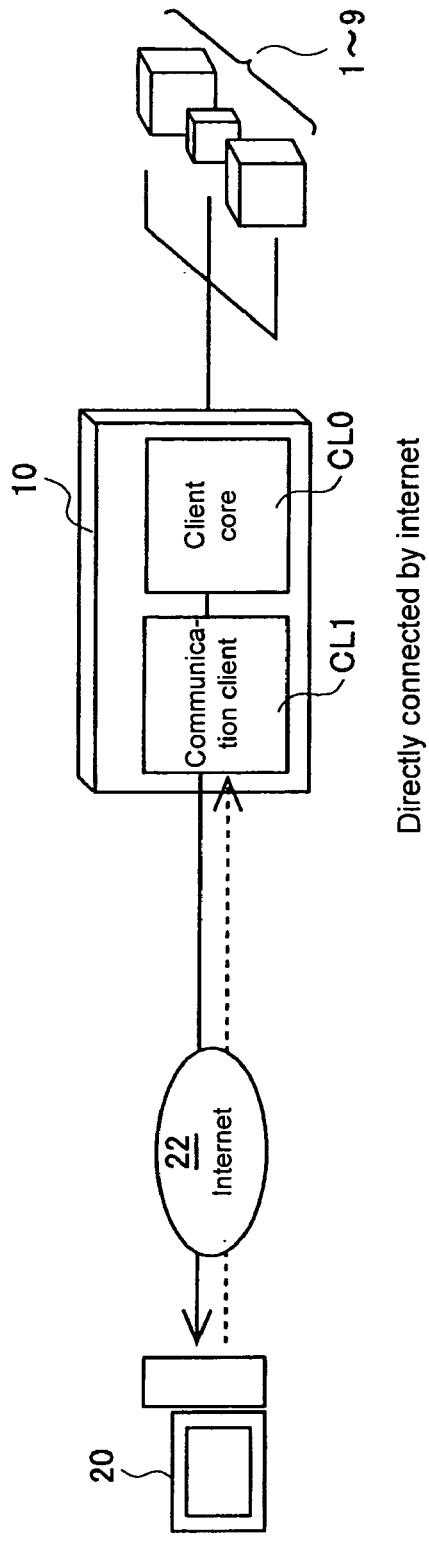
FIGS. 14A–14B is a diagram for explaining a form of connection between the application server and the board packaging line coordinating computer.

In the first form of connection, as shown in FIG. 14A, the application server 20 and the board packaging line coordinating computer 10 are connected directly to each other through the internet 22, as described above. Specifically, the board packaging line coordinating computer 10 contains a client core CL0 adapted to perform the main functions (10a to 10q) and a communication client (remote client 10r) CL1 engaged mainly in the internet communication. This communication client CL1 is connected directly to the internet 22 for communication with the application server 20. This first form of connection is effectively used in the case where the board packaging line coordinating computer 10 is placed in an environment connectable to the internet.

Figure 14B:
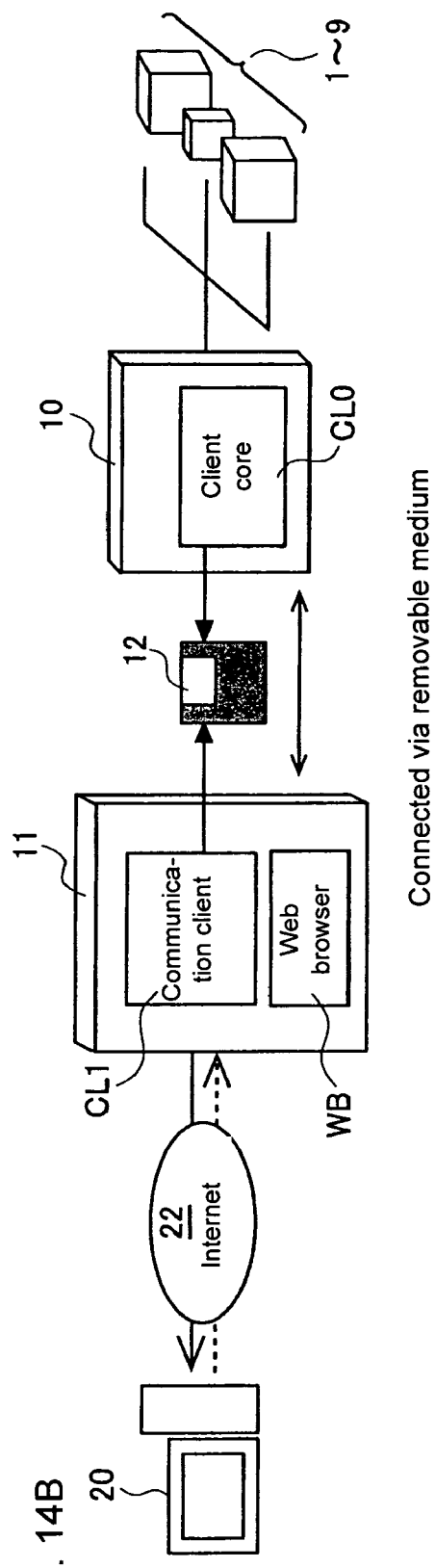

The second form of connection is shown in FIG. 14B. The application server 20 and the board packaging line coordinating computer 10 are connected to each other through a FD or a rewritable CD, MO, etc. or the like removable medium 12. Specifically, a relay computer 11 is provided in addition to the board packaging line coordinating computer 10 on the customer side. The relay computer 11 contains a communication client CL1 for carrying out the internet communication using the Web browser WB. This communication client CL1 is directly connected to the internet 22 for communication with the application server 20. The information is exchanged between the relay computer 11 and the board packaging line coordinating computer 10, on the other hand, through the removable medium 12. This second form of connection is effectively used in the case where the board packaging line coordinating computer 10 is placed in an environment where the internet connection is difficult.

Figure 15:
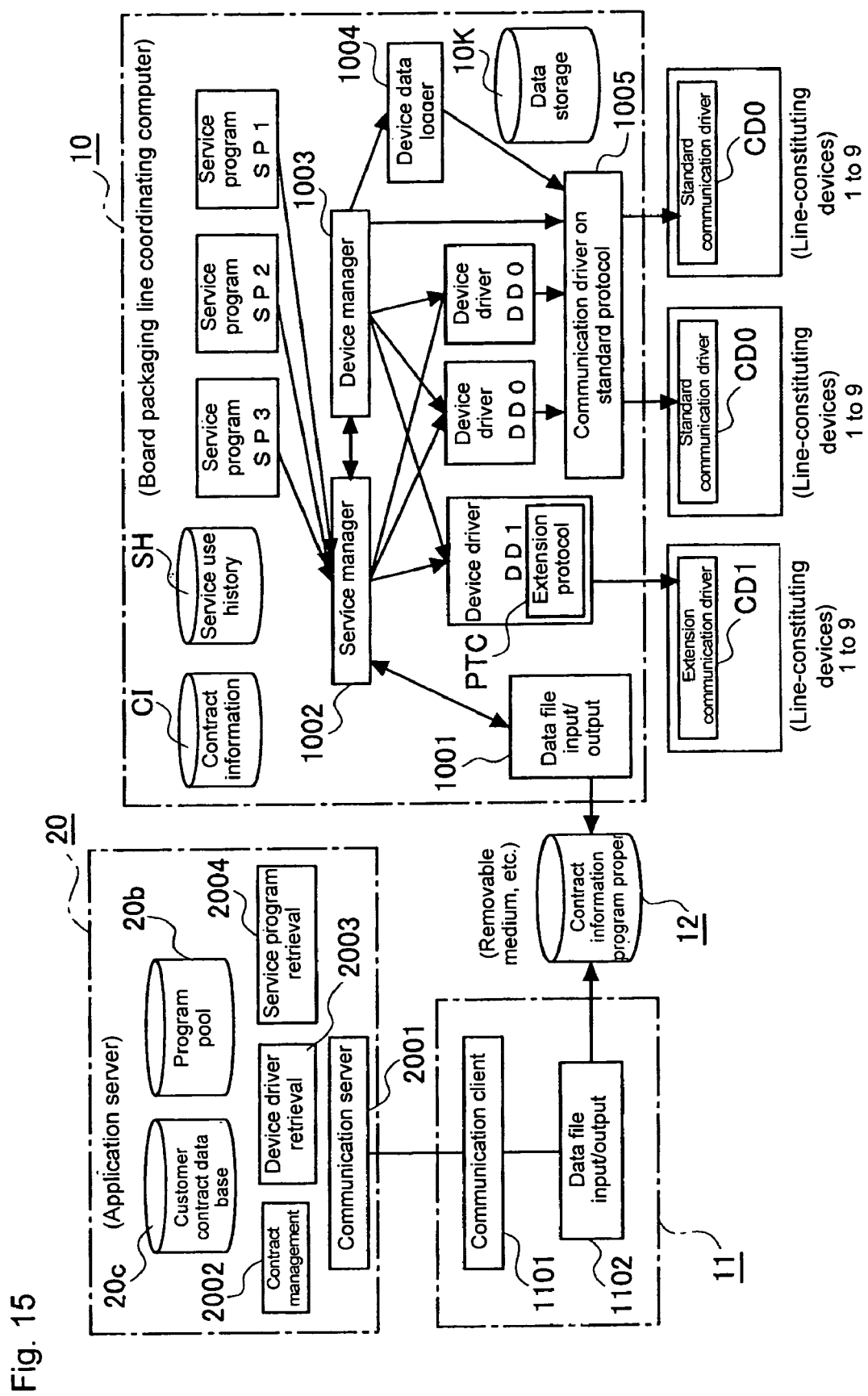
FIG. 15 is a block diagram schematically showing a software configuration of a system according to the invention.

The software structure of the system according to the invention is schematically shown in FIG. 15. In the shown case, the second form of connection is employed. To realize the system according to the invention, various software (computer programs) are incorporated in the devices 1 to 9 making up the line, the board packaging line coordinating computer 10, the relay computer 11 and the application server 20.

The devices 1 to 9 making up the line has built therein a standard communication driver CD0 or an extension communication driver CD1 as a system program. The "communication driver" corresponds to the "communication servers" 1a to 8a shown in FIG. 3. The standard communication driver CD0 is the software incorporating the communication procedure (standard protocol) shared by the line-constituting devices 1 to 9. The extension communication driver CD1, on the other hand, is the software incorporating the communication procedure (extension protocol) unique to the line-constituting devices 1 to 9.

The software incorporated in the board packaging line coordinating computer 10 as a system program includes a data file input/output 1001, a service manager 1002, a device manager 1003, a device data logger 1004 and a communication driver 1005 based on the standard protocol.

Further, reference character CI designates the contract information downloaded from the application server 20, character SH the service use history generated each time by the coordinating computer 10, characters SP1 to SP3 various service programs (such as a program used for one of the applications including the set-up management, secular variation management and the defect source estimation or a combination of any thereof) downloaded from the application server 20, character 10k a data storage for holding the board processing result data acquired from the line-constituting devices 1 to 9, character DD0 a standard device driver downloaded from the application server 20, and character DD1 an extension device driver (for supporting the extension protocol PTC) downloaded from the application server 20. The device drivers DD0 and DD1 have communication drivers corresponding to the line-constituting devices 1 to 9, respectively, and acquire the data from the devices 1 to 9. Also, in response to the request from the service programs SP1 to SP3, the data are retrieved from the data storage 10k and the data with a logic name attached thereto is supplied.

The data file input/output 1001 is under the control of the service manager 1002 and implements the function by which the data required by the communication client 1101 of the relay computer 11 for communication with the application server 20 are written out as a file into a recording medium such as a removable medium, and the file held by the communication client 1101 is read from the recording medium. The service manager 1002, interposed between the various service programs SP1 to SP3 and the device drivers DD0 and DD1, realizes the function of automatically setting up and executing the service programs SP1 to SP3 in accordance with the contract information CI. A device manager 1003, under the control of the service manager 1002, realizes the function of automatically installing the device drivers DD0 and DD2 connected thereto. A device data logger 1004 realizes the function of acquiring data real time from the line-constituting devices 1 to 9 and holding the data in the data storage 10k. The data storage 10k is a storage medium for holding the board processing result data acquired from the devices (constituent devices 1 to 9). The device driver (DD0, DD1) includes a standard or extension communication driver corresponding to the devices, and realizes the function of acquiring the data from the devices on the one hand, and retrieving the data from the data storage 10k at the request of the application program and supplying the data with a logic name attached thereto. Further, the standard communication driver CD0 in the line-constituting devices 1 to 9 is the software incorporating the communication procedures (standard protocol) shared by the devices, and the extension communication driver CD1 is the software incorporating the communication procedure (extension protocol PTC) unique to the devices.

The software built in the relay computer 11 as a system program include a communication client 1101 for issuing a processing request to and acquiring the processing result from the server 20 through the internet, and a data file input/output software 1102 for realizing the function of writing the data to be transmitted to the server 20 and the data obtained from the server 20, as a file in the removable medium 12.

The software incorporated as a system program in the application server 20 includes a communication server 2001, a contract management 2002, a device driver retrieval 2003 and a service program retrieval 2004. The communication server 2001 realizes the function of receiving the command processing request arriving from the communication client 1101 of the relay computer 11 through the internet and returning the processing result to the communication client 1101. The contract management 2002, in collaboration with the customer contract data base 20c, writes, updates and reads the contents of the contract or otherwise realizes the function of other management affairs. The customer data base 20c has held therein the customer service contract. The device driver retrieval 2003 realizes the function of retrieving a designated device driver from the program pool 20b. The service program retrieval 2004 realizes the function of retrieving a designated service program (SP) from the program pool 20b. Incidentally, the program pool 20b has held therein an application program and a device driver.

Figure 16:
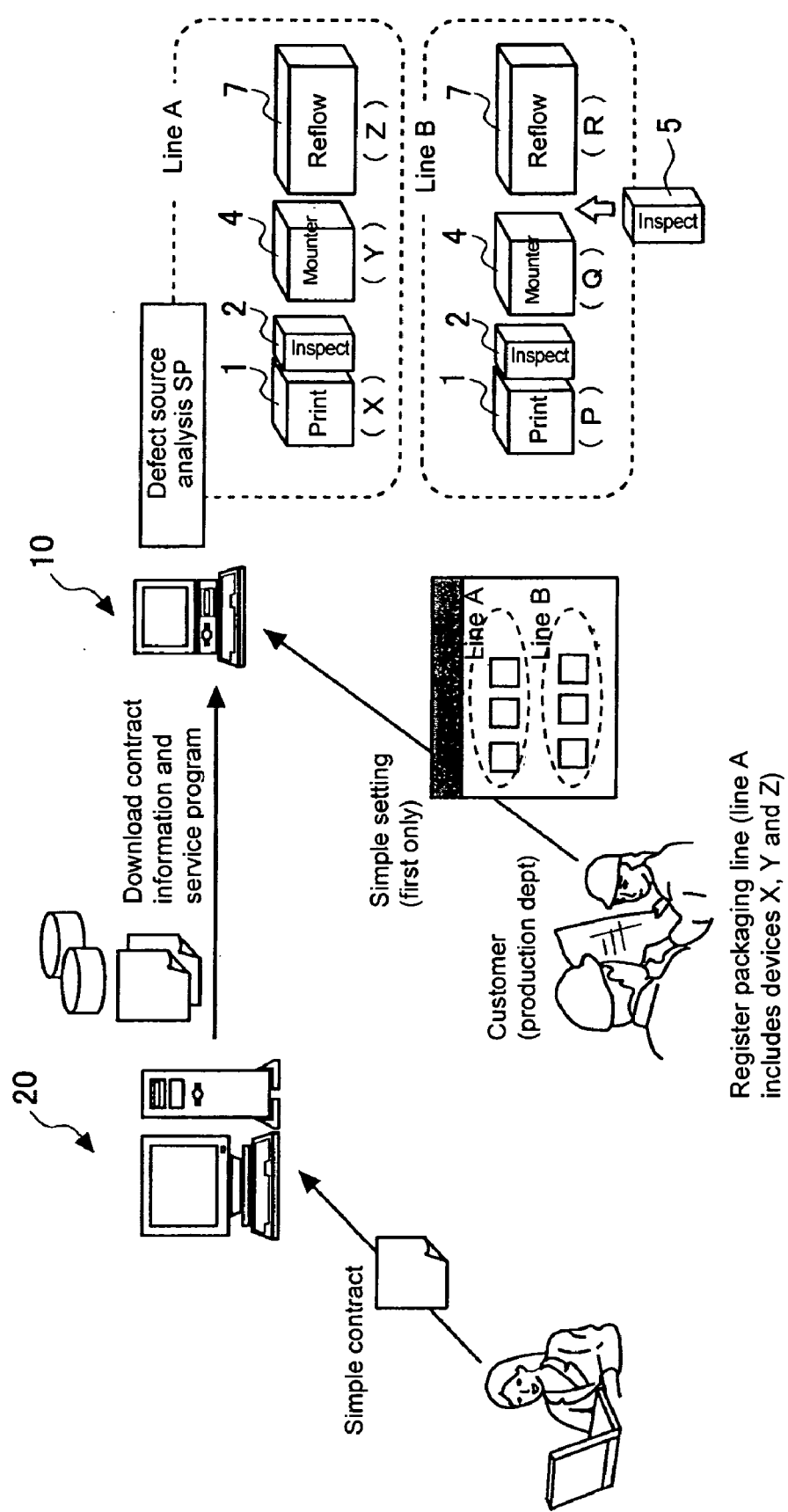
FIG. 16 is a diagram for explaining the flow of the process from signing the contract to starting the service.

Next, a method embodying the invention based on the system configuration and the software structure described above is explained. The flow for explaining the process from the contract signing to the service start is shown in FIG. 16.

First, a board packaging line is constructed. Specifically, the package defect source determining system is introduced as an initial step. More specifically, the required measuring device 5 is mounted to construct a board packaging line. In the case under consideration, the line A includes the printing device 1, the inspection device 2, the mounter 4 and the reflow furnace 7. The line B includes the printing device 1, the inspection device 2, the mounter 4, the inspection device 5 and the reflow furnace 7. After that, the devices 1 to 7 are connected to the board packaging line coordinating computer 10 through LAN, and the particular board packaging coordinating computer 10 is rendered connectable to the application server 20. This connection may take either the first or second connection form shown in FIG. 14.

Then, a simple proposal for signing a contract is offered by the operator to the application server 20. This proposal can be made using telephone, fax, internet or the like. The terms and conditions of the contract signed in this case may be comparatively rough. In this example, the service contract information is prepared with each board packaging line as a basic unit and includes the information for identifying the applicable board packaging line coordinating computer, the information for identifying the board packaging line, the information for identifying the application program used on the particular line, the number of the devices that can be registered and the number of the devices that can be changed. The information on the service contract thus signed are registered in the customer data base 20c in the application server 20.

Then, in response to a predetermined operation of the man-machine interface on the part of the customer, the board packaging line coordinating computer 10 downloads the "service contract information" from the application server 20, while at the same time downloading the application program (service program SP) defined in the "service contract information" from the application server 20. In the process, the application program downloaded is assumed to be a program usable for any one of the applications including the set-up management, secular variation management and the defect source estimation or any combination thereof.

Next, the board packaging line coordinating computer 10, based on the downloaded "service contract information", defines the board packaging line covered by the particular application program and the device configuration of the line, while at the same time uploading the defined device configuration to the application server 20.

Figure 17:
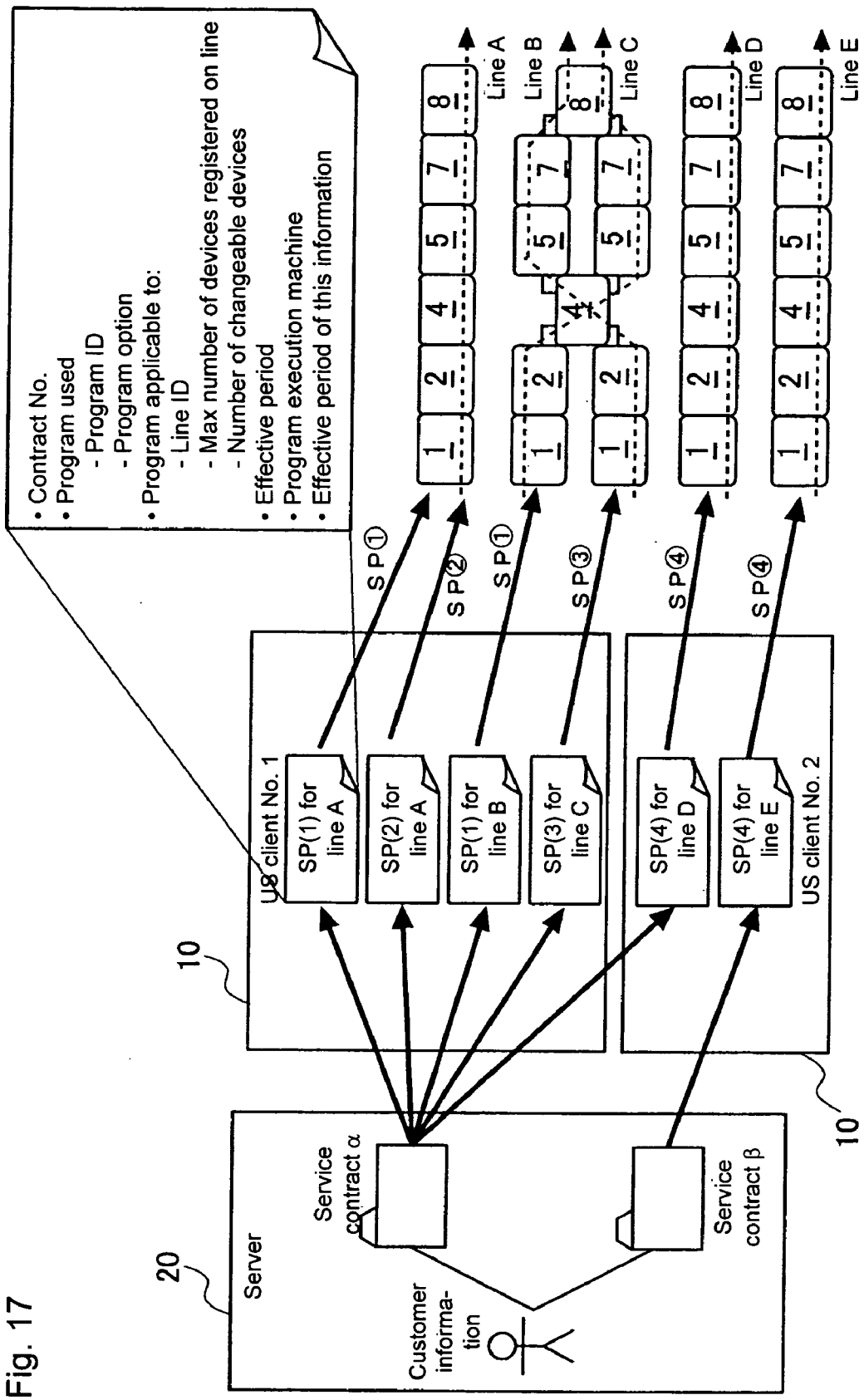
FIG. 17 is a diagram for explaining the contents of the contract information and the manner in which a program acts on the line.

The diagram for explaining the manner in which the contents of the contract information and the program works on the line is shown in FIG. 17. In this case, the application server 20 holds two types of service contracts (described as a service contract α and a service contract β in the drawing) for a specific customer. The customer, on the other hand, is provided with two board packaging line coordinating computers (described as a US client No. 1 and a US client No. 2 in the drawing) 10. The first board packaging line coordinating computer (US client No. 1) coordinates and controls three board packaging lines (lines A, B and C). The second board packaging line coordinating computer (US client No. 2) coordinates and controls two board packaging lines (lines D and E). As indicated by arrows in the drawing, the service contract α contains five service contract information (SP(1) for line A, SP(2) for line A, SP(1) for line B, SP(3) for line C and SP(4) for line D), and the service contract β contains one service contract information (SP(4) for line E). The term SP is an abbreviation of the service program. Each contract information, as shown, contains the "contract number", the "ID of the line covered by the applicable program", the "program option for the applicable program", the "ID of the line covered by the program", the "maximum number of registered devices (number of devices) on the line covered by the applicable program", the "number of changeable devices (number of devices) on the line covered by the applicable program", the "effective period of the contract", the "program execution machine ID" and the "effective period of the information". As described later, the program execution can be suppressed based on these information. The wording "the suppression of program execution" means (1) to limit the applicable devices depending on the line, (2) to limit the executable period, (3) to limit the program execution machine, and (4) to limit the program starting unless data exchange (transmission of the charge information) is carried out with the server.

The service contract information is shown in detail in the table of FIG. 20. As apparent from this drawing, the service contract information contains the "service contract ID number", the "service contract name", the "starting date of the effective period", the "last date of the effective period", the "client ID", the "program ID", the "SP option character string", the "applicable line ID", the "maximum number of registered devices", the "number of allowable changes of device registration" and the "effective period of the information".

The "service contract ID number" is the number specifying the service contract managed by the server in correspondence with the customer information. The "service contract name" is the title name. The "starting date of the effective period" is the starting date of the period during which execution of the application program is allowed under the contract. The "last date of the effective period" is the last day of the period during which the execution of the application program is allowed under the contract. The "client ID" is the ID of the line coordinating computer on the user side allowed to execute the application program. The "program ID" is the ID designating the application program that can be used under the contract. The "SP option character string" is a character string used for setting an option (on/off of a specific function) read by the application program. The format is dependent on the user application program. The "applicable line ID" is an ID indicating the board packaging line covered by the contract. The "maximum number of registered devices" is a value limiting the total number of devices registered on the board packaging line under the contract. The "number of allowable changes of device registration" is the number of devices whose configuration can be changed after starting the application program. The "effective period of the information" is the effective period starting from acquisition of the contract information from the server by the line coordinating computer on the user side. Unless the effective period is renewed before expiry thereof while exchanging data with the server, the software of the board packaging line coordinating computer prohibits the execution of the application program. The description "0" day in this case indicates that there is no effective period.

With regard to the device configuration of the line, in FIG. 17, the lines A, D and E have the same device configuration, which includes the cream solder printing device 1, the inspection device 2, the mounter 4, the inspection device 5, the reflow furnace 7 and the inspection device 8. The lines B and C, though basically the same in device configuration, are different from the other lines in that the mounter 4 and the inspection device 8 are shared by the two lines.

Next, the application server 20 retrieves the required device driver from the device driver group, based on the device configuration uploaded from the board packaging line coordinating computer 10.

Then, the board packaging line coordinating computer 10 downloads the retrieved device driver from the application server and sets it in each device. More specifically, the board packaging line coordinating computer 10 having the client ID information contained in the service contract information defines the board packaging line covered by the particular application program and the devices constituting the particular board packaging line, based on the line ID information of the service contract information, the program ID information and the number of registrable devices, while at the same time setting the input/output correspondence between the application program and applicable devices.

Figure 18:
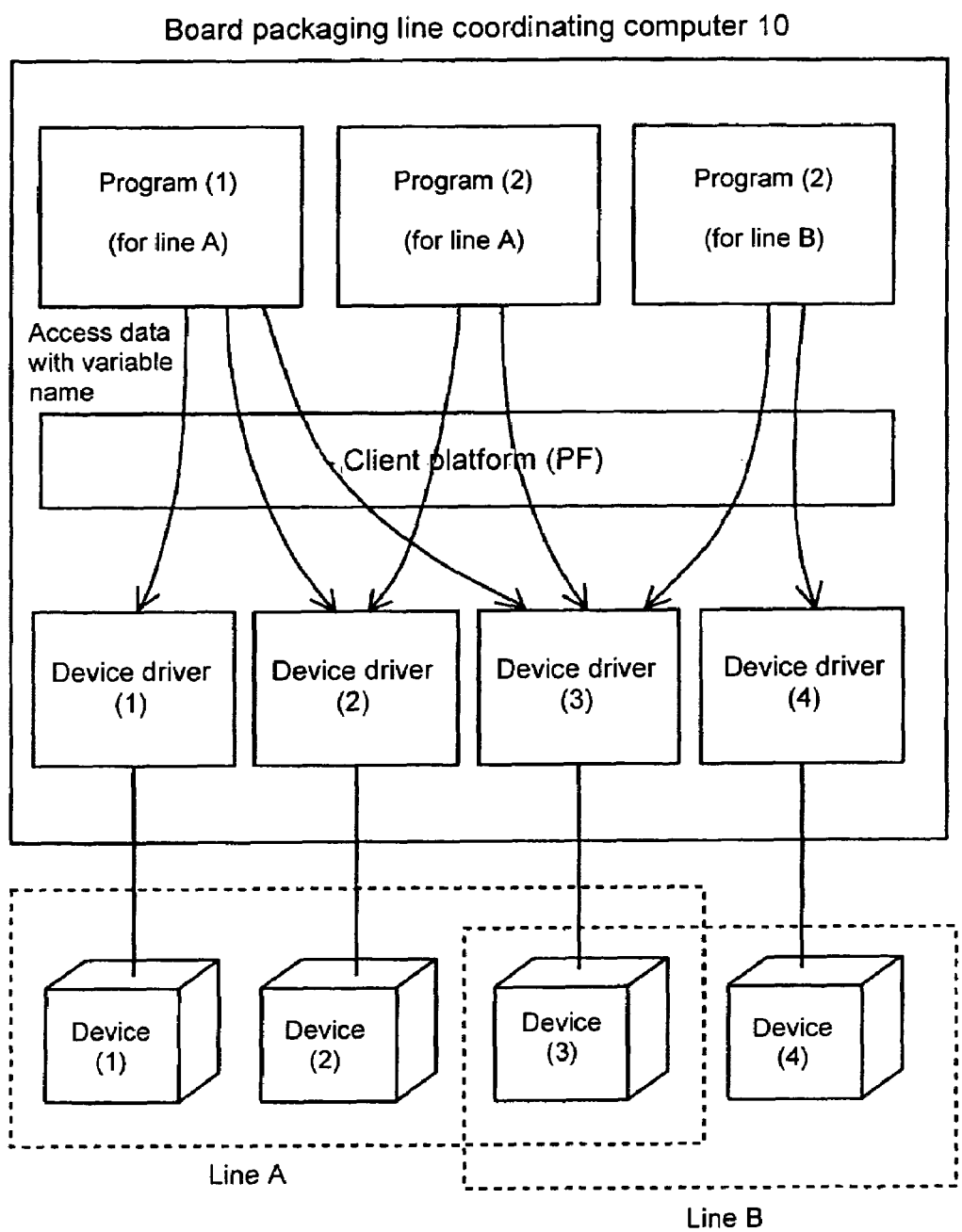
FIG. 18 is a diagram for explaining the interface between each constituent device of the board packaging line and the service program.

The diagram for explaining the input/output interface between each device constituting the board packaging line and the service program (application program) is shown in FIG. 18. As shown in FIG. 18, assume that three application programs (program (1) for line A, program (2) for line A and program (2) for line B) are downloaded to the board packaging line coordinating computer 10. In this case, each program contains the description to the effect that the data is to be acquired according to a logic variable name without specifically designating a device. Then, the client platform (PF) retrieves the device for which the data of the designated variable name can be acquired, from the devices included in the line covered by the program, and delivers to the program the data acquired from the retrieved device. The device drivers (1) to (4), which themselves have a logic variable name, acquire the data by communication with the devices (1) to (4) and map the acquired data to the logic variable name of themselves. As a result, the input/output correspondence between the application program and the applicable device can be automatically set up. Specifically, the customer is not required to grasp the detailed configuration of the board packaging line at the time of signing the contract, and even in the case where the configuration of the packaging line undergoes a change, the customer is not required to sign the contract anew. Once the customer has registered the configuration of the board packaging line, the device requiring a service program need not be designated each time the service program is installed. Also, the customer is not required to change all the service program setting but may simply alter the registered configuration of the packaging line even in the case where the configuration of the packaging line is changed.

Assume that the device configuration of the board packaging line is changed after introducing a predetermined application program to the board packaging line, and that the scope of the device configuration change is not more than the number of changeable devices contained in the initial "service contract information". Then, the board packaging line coordinating computer 10 changes the device configuration used on the line without altering the terms and conditions of the contract, while at the same time setting a device driver corresponding to the changed device configuration. Further, the input/output correspondence between the application program and the changed applicable device is set anew. In the case where the device driver cannot be set in a way corresponding to the changed device configuration, the board packaging line coordinating computer 10 uploads the changed device configuration to the application server 20, which retrieves the required device driver based on the device configuration uploaded. The board packaging line coordinating computer 10 downloads the retrieved device driver from the application server 20, and sets it anew in each device.

After introducing the predetermined application program to the board packaging line, the board packaging line coordinating computer 10 uploads the data on actual use of the application program under the contract for a predetermined cycle period to the application server 20. In the case where the inspection by the application server 20 of the data on actual use shows that the effective period has not expired, the customer is charged in accordance with the charging conditions based on the data on actual use, so that the latest application program can be downloaded to the board packaging line coordinating computer based on the service contract. In the case where the effective period has expired, in contrast, the charge amount, the charge information to be added and the contract renewal information are transmitted to the board packaging line coordinating computer 10. Thus, until the contract is renewed, the downloading of the latest application program by the board packaging line coordinating computer is prohibited.

The board packaging line coordinating computer 10 collects and stores therein the data on the actual use, item by item, of the application program, including the total execution time of the application program, the total standby time, the number of times a specific algorithm is operated, the number of times the operation result is displayed, the number of boards processed and the number of specific boards extracted. Based on these data on actual use, individually or in combination, the application server makes a variety of specific charge in accordance with predetermined charging conditions.

Based on the contract information including the effective period of the application program and the effective period of the contract, the application server 20 controls the charge and the downloading of the latest application program to the board packaging line coordinating computer.

Figure 19:
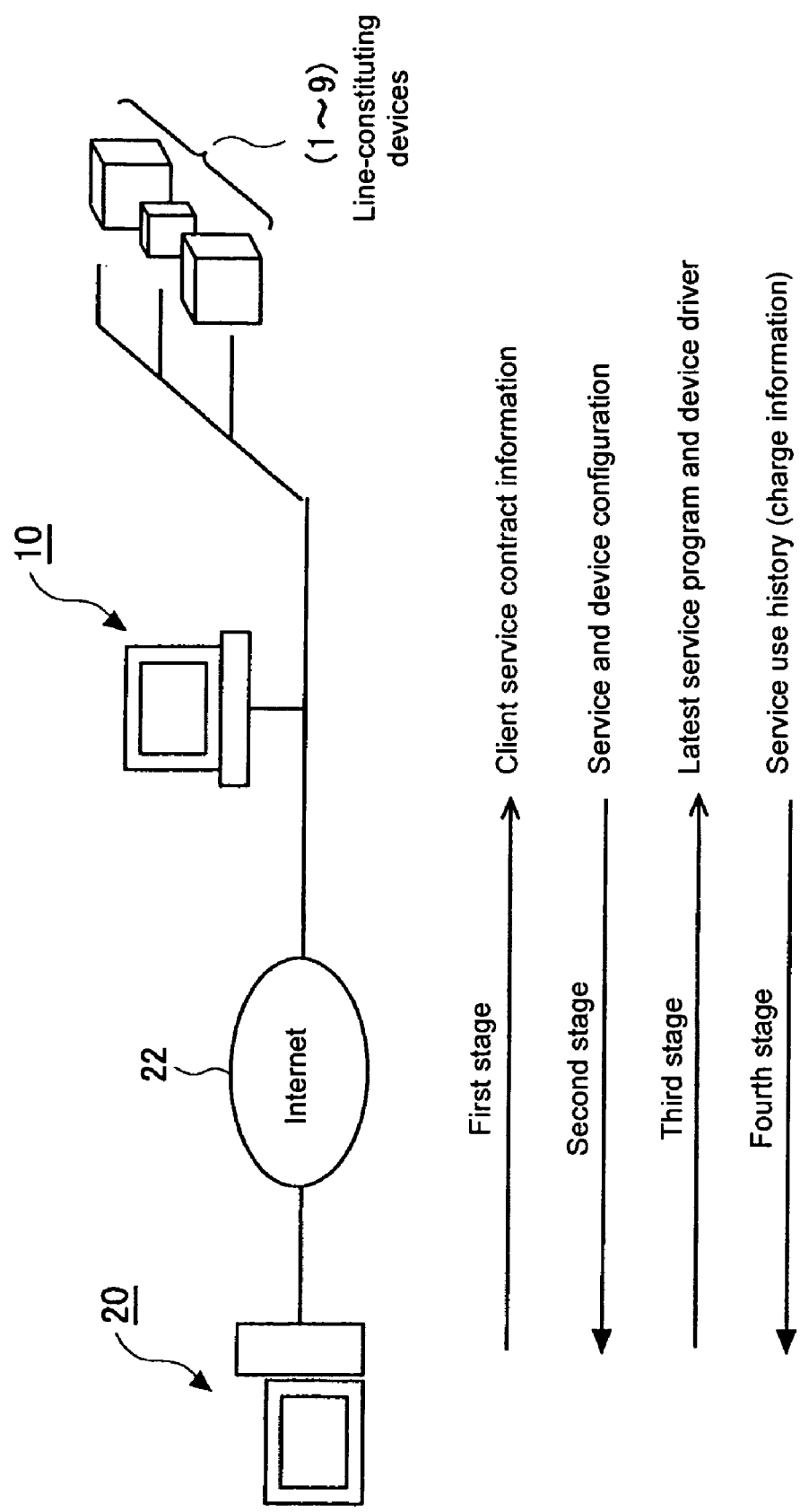
FIG. 19 is a diagram for explaining the information exchange between the application server and the board packaging line coordinating computer.

An outline of information exchange between the application server 20 and the board packaging line coordinating computer 10 described above is shown collectively in FIG. 19. Specifically, in the first stage, the client service contract information is downloaded from the application server 20 to the board packaging line coordinating computer 10. In the second stage, the service or the device configuration required by the client is uploaded from the board packaging line coordinating computer 10 to the application server 20. In the following third stage, the latest service program or the latest device driver is downloaded from the application server 20 to the board packaging line coordinating computer 10. In the fourth stage, the actual service history including the charge information is intermittently uploaded from the board packaging line coordinating computer 10 to the application server 20.

Figure 22:
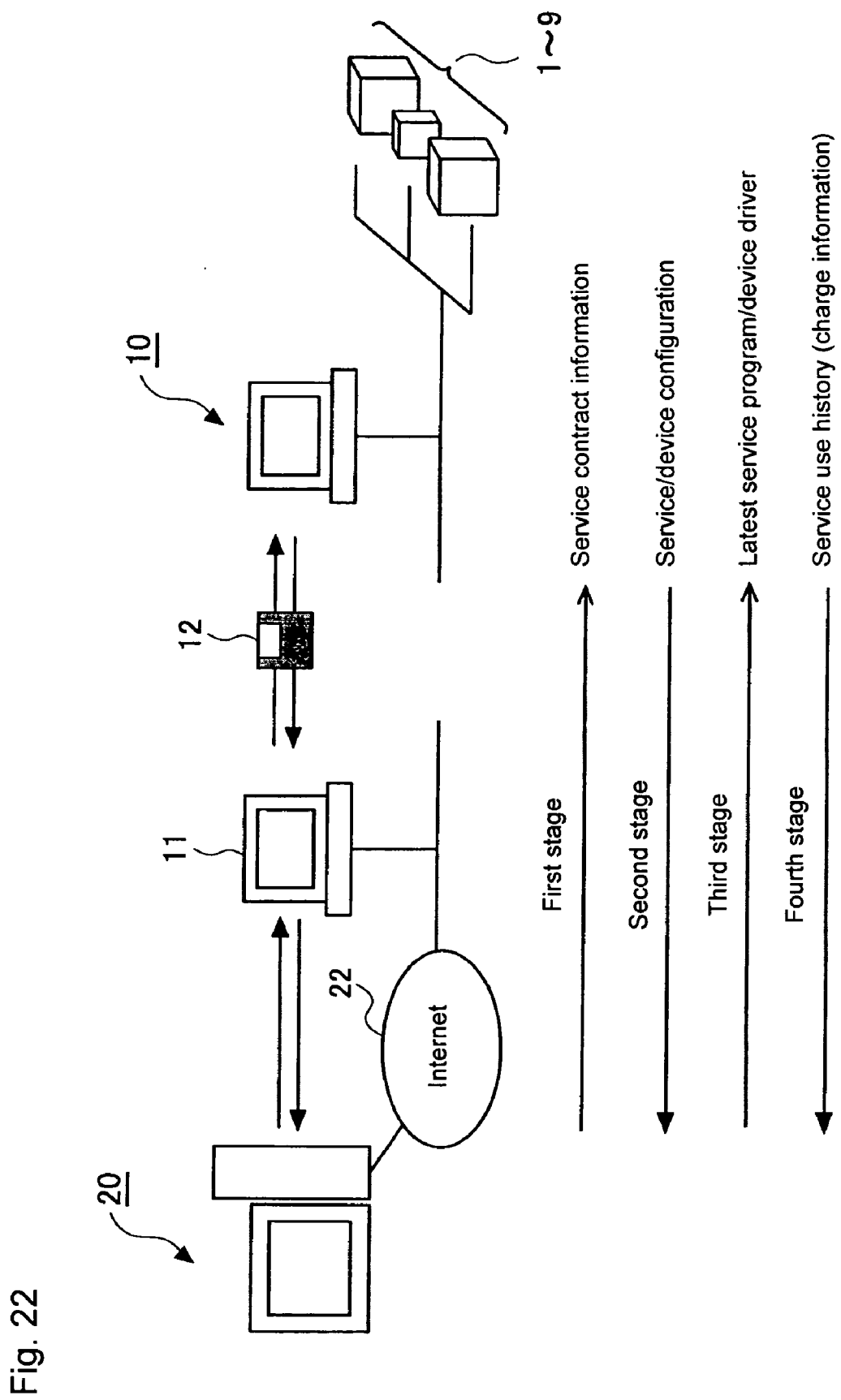
FIG. 22 is a diagram for explaining the information exchange between the application server and the board packaging line coordinating computer through a removable medium.

Next, the information exchange between the application server 20 and the line coordinating computer 10 through the removable medium 12 is explained with reference to FIG. 22, and the data exchange between the application server and the line coordinating computer through the removable medium 12 with reference to FIG. 23.

Figure 23:
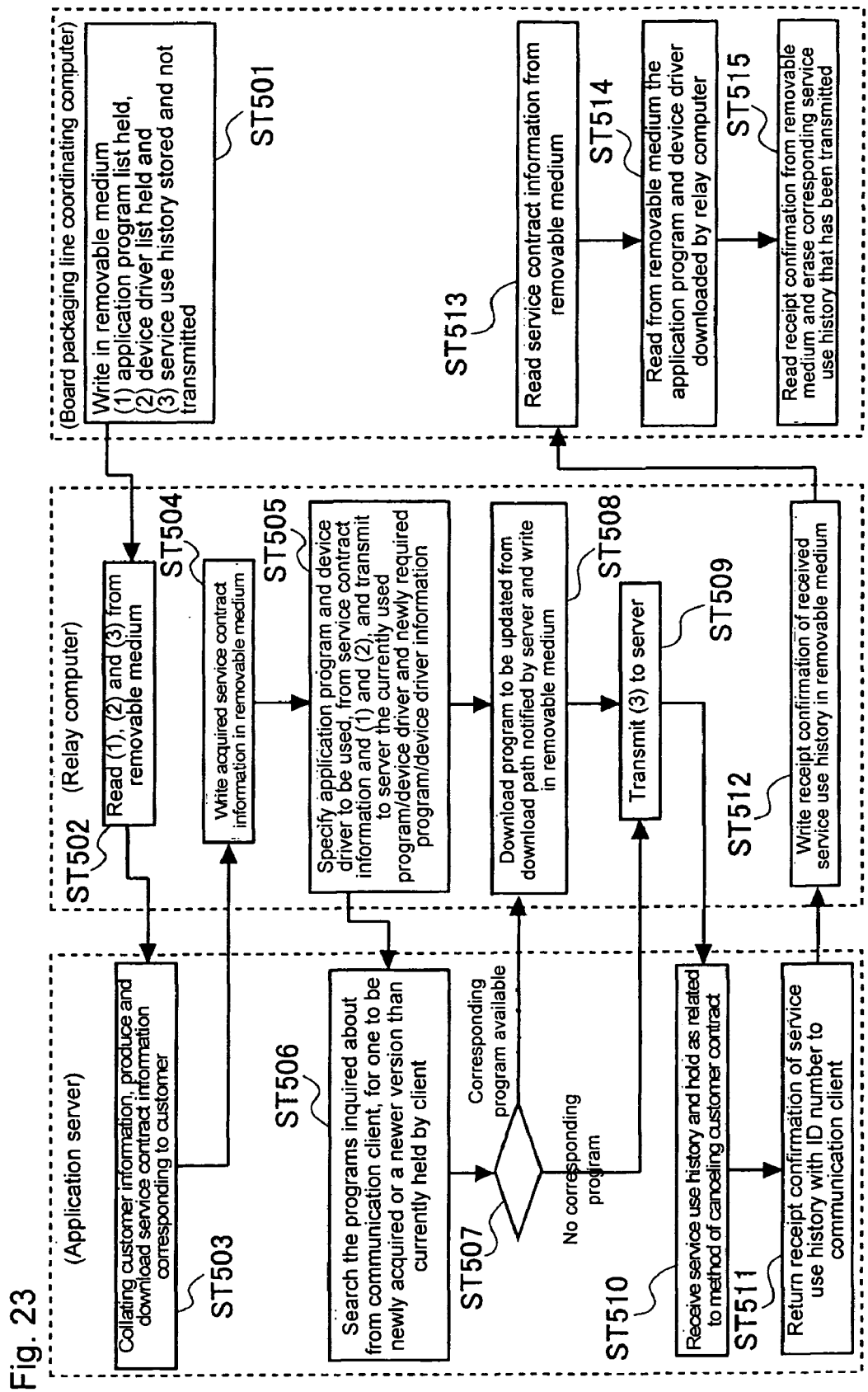
FIG. 23 is a flowchart showing the data exchange processing between the board packaging line computer and the application server through a removable medium.
Figure 24:
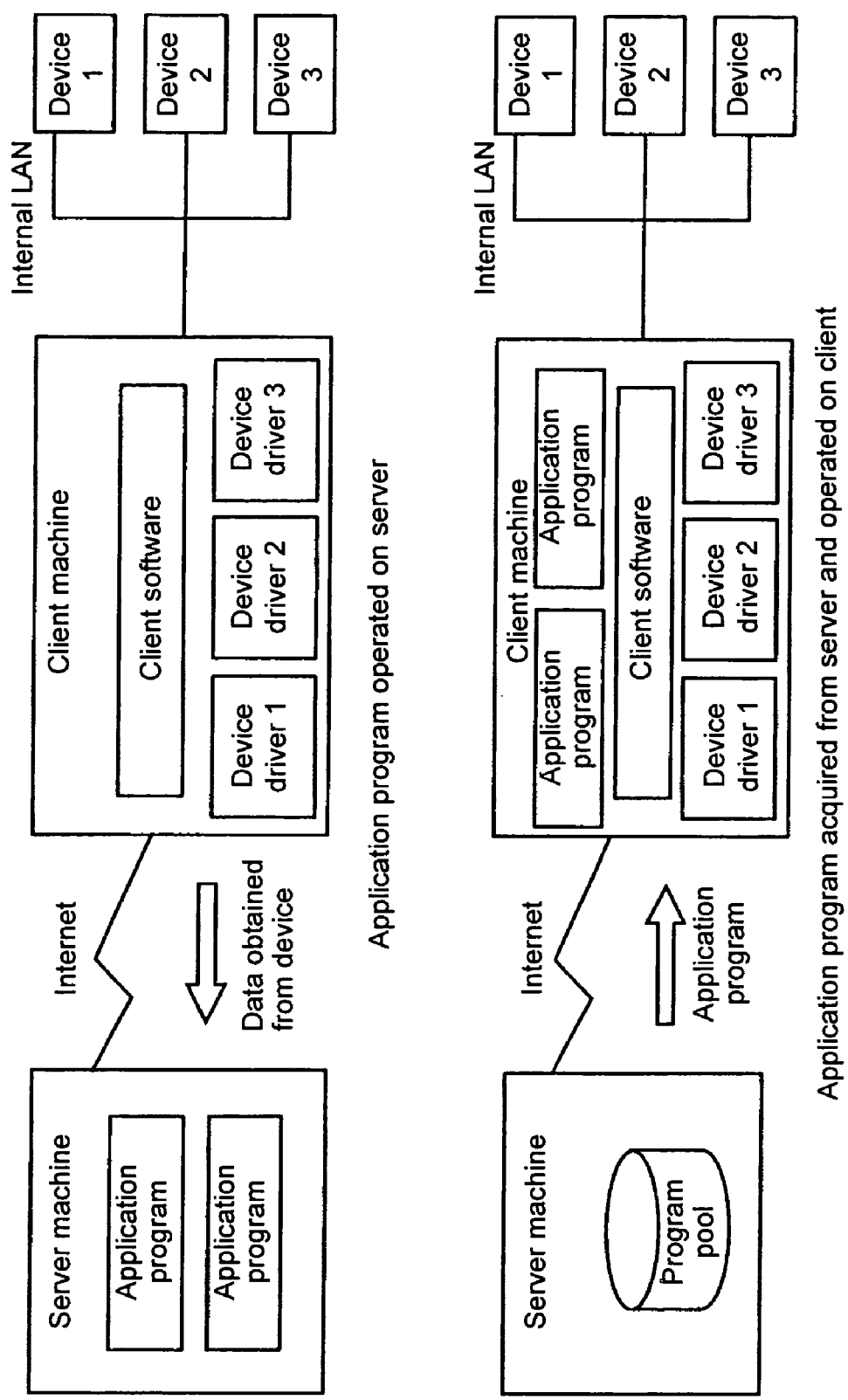
FIG. 24 is a diagram for explaining the conventional method of providing an application service.

In FIG. 23, with the start of the process, the first step 501 is executed in the board packaging line coordinating computer 10, so that (1) the list of the application programs held, (2) the list of the device drivers held and (3) the actual service history stored and not transmitted are written in the removable medium 12. The removable medium in which the data are written in this way is transported to the relay computer 11 by the operator or the like on the user side.

Then, the relay computer 11 executes step 502, so that (1) the list of the application programs held, (2) the list of the device drivers held and (3) the actual service history stored and not transmitted are read from the removable medium 12. Then, step 503 is executed in the application server 20 connected through the internet, the customer information is collated, and the service contract information corresponding to the customer is prepared and downloaded.

Then, step 504 is executed in the relay computer 11, and the process of writing the acquired service contract information in the removable medium 12 is executed. In the relay computer 11, step 505 is executed, the application program and the device driver to be used are specified from the service contract information, (1) the list of the application programs held and (2) the list of the device drivers held. Then, the information on the currently-used program/device driver and the new program/device driver are transmitted to the server.

In the application server 20, step 506 is executed, so that the programs about which the inquiry is made from the relay computer 11 are searched for a version to be newly acquired or a newer version than the current one held by the client. In the case where the research result shows that such a program is available, step 508 is executed in the relay computer 11. The program to be updated is downloaded from the download path notified by the server and written in the removable medium. Then, in the relay computer 11, step 509 is executed, and the service use history stored and not transmitted is transmitted to the server.

In the case where it is determined in step 507 following step 506 that there is no corresponding program, step 509 is executed in the relay computer 11 and the service use history is transmitted to the server in a similar manner to the preceding case. Then, step 510 is executed in the application server 20, and the service use history is received and held as data related to the customer contract information. Further, step 511 is executed, and the confirmation is returned to the communication client (relay computer) 11 with the ID number attached to the service use history.

Then, step 512 is executed in the relay computer 11, and the confirmation of receipt of the service use history is written in the removable medium 12. In the board packaging line coordinating computer 10, step 513 is executed, so that the service contract information is read from the removable medium 12. Step 514 is executed, and the application program and the device driver downloaded by the relay computer 11 are read from the removable medium 12. Further, step 515 is executed, so that the receipt confirmation is read from the removable medium 12 and the corresponding service use history that has been transmitted is erased.

As the result of execution of the aforementioned processing steps 501 to 515, the data are exchanged only twice between the coordinating computer 10 and the relay computer 11 through the removable medium 12. In real terms, however, as shown in FIG. 22, equivalent information exchange is carried out each time. Specifically, in the first stage, the service contract information is sent to the line coordinating computer 10 through the relay computer 11 and the removable medium 12 from the application server 20. In the second stage, the service and device configuration are sent to the application server 20 from the line coordinating computer 10 through the removable medium 12 and the relay computer 11. In the third stage, the latest service program and device driver are sent to the line coordinating computer 10 from the application server through the relay computer 11 and the removable medium 12. In the fourth stage, the service use history (charge information) is sent to the application server 20 from the line coordinating computer 10 through the removable medium 12 and the relay computer 11.

The application program downloaded to the board packaging line coordinating computer 10 is executed only in the case where predetermined conditions are met. This limited process of starting the application is shown in detail in the flowchart of FIG. 21.

Figure 21:
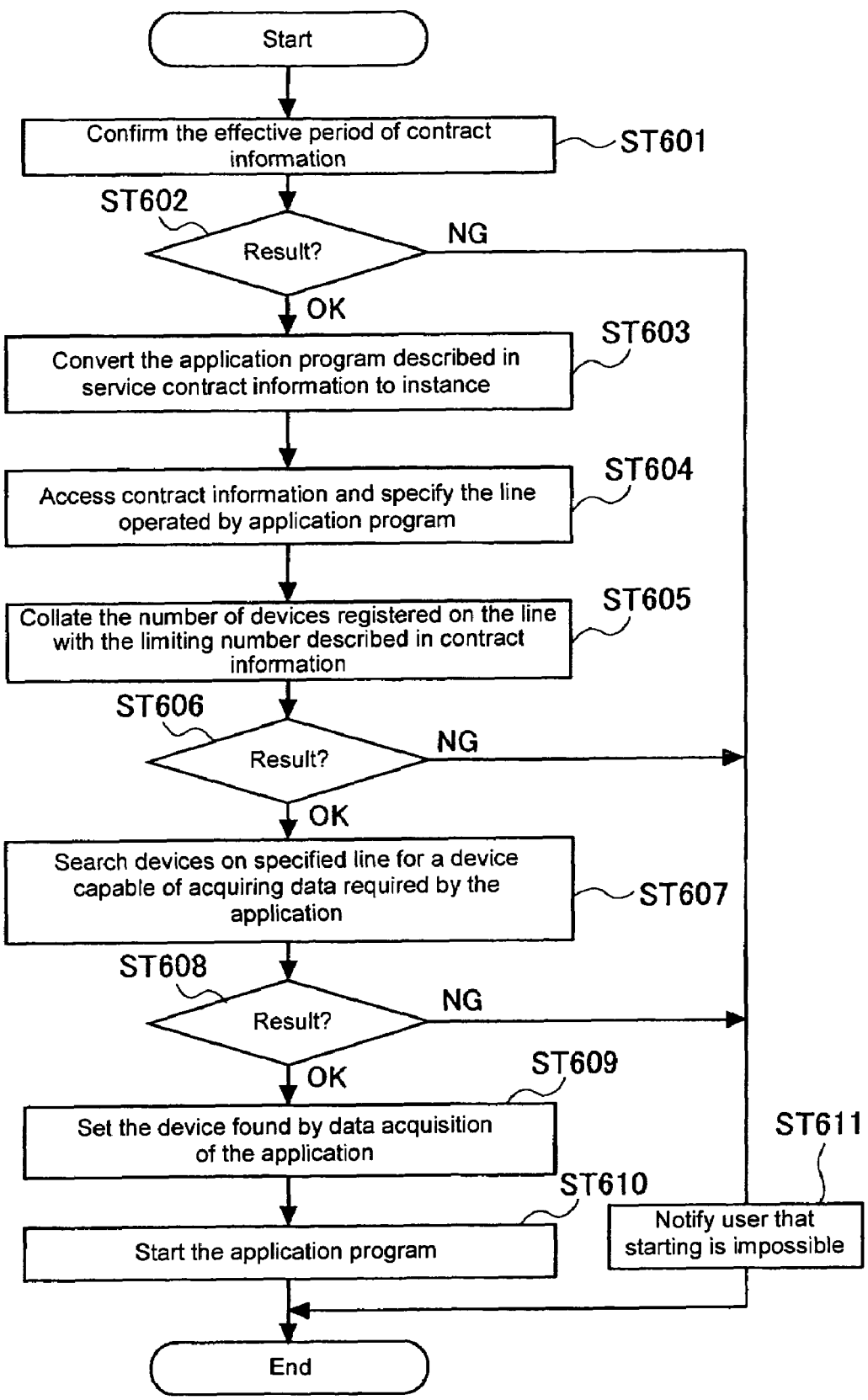
FIG. 21 is a flowchart showing the process of starting an application with a limitation.

In FIG. 21, once the process is started, step 601 is executed first of all to confirm the effective period of the contract information. Step 602 is executed to determine the confirmation result. In the case where the confirmation result is "NG", the process proceeds to step 611 to notify the user that the starting is impossible.

In the case where the confirmation result in step 602 is "OK", on the other hand, step 603 is executed, and the application program described in the service contract information is converted into an instance. Step 604 is executed to access the contract information and specify the line associated with the application program. Step 605 is executed to collate the number of devices registered on the line with the limited number described in the contract information. Step 606 is executed to determine the collation result. In the case where the collation result is "NG", the process proceeds to step 611 to notify the user that the starting is impossible.

In the case where the determination in step 606 is "OK", on the other hand, step 607 is executed to search the devices associated with the specified line for a device that can acquire the data required by the application. Then, step 608 is executed to determine the research result. In the case where the determination result is "NG", step 611 is executed to notify the user that the starting is impossible.

In the case where the determination in step 608 is "OK", on the other hand, step 609 is executed to set the device found as a data source of the application. Step 610 is executed to start the application program. According to this embodiment, the starting of the application program is limited in three stages, so that the execution of the application program downloaded to the user can be indirectly controlled by the server. In the aforementioned case, the "effective period of this information" described in the table of FIG. 20 is used to limit the effectiveness of the application program (ST601). As an alternative, the "starting date of the effective period" and the "last date of the effective period" in the same table may be used to permit the execution of the application program only during the particular period.

In operating the board packaging line, the board packaging line is actually activated, and the package defect source determining program is executed based on the information obtained from the inspection devices and the measuring devices thereby to determine a package defect source. As a result, the parameters of each device making up the board packaging line are adjusted so that a stable system with a suppressed fraction defective can be constructed. Also, in the case where the need of the maintenance work arises for the board packaging line, the application server 20 is accessed to request the downloading of the software so that the package defect source determining program and the communication driver are automatically added and updated. After that, the board packaging line is operated. At the same time, a package defect source is determined based on the new package defect source determining program and the new communication driver set up by the maintenance work.

As described above, the operation of the board packaging line and the maintenance work of the board packaging line are repeated at an appropriate timing. The package defect source determining program and the communication driver registered in the application server 20 are updated each time for version up. Then, each board packaging line coordinating computer 10 accesses the application server 20 and receives the latest package defect source determining program. Based on the latest packaging technique and know-how, therefore, a defect source can be determined for an improved production quality on the production line. In the construction and maintenance phase of the board packaging line, the function of automatically updating the package defect source determining program and the communication driver can save the labor of maintenance and setting of the software.

As described above, according to this embodiment, a plurality of board packaging lines built around the application server 20 are connected to each other by internet through the board packaging line coordinating computer 10, and the package defect source determining program is fitted with the individual configuration of the board packaging line (by changing the model of the service setting information in accordance with the contract information stored in the customer data base 20c). In addition, this process can be executed automatically. In this way, while introducing a package defect source determining program to many board packaging lines, the labor and cost of updating the program when and after introducing the program can be reduced.

Further, the customer is not required to acquire and set up the driver corresponding to the devices on the production line or the application program covered by the contract, with the result that the trouble accompanying the program set-up can be avoided at the time of switching the software or changing the device configuration of the production line. The customer can use the latest, optimum program and driver without being specifically conscious of them. The service provider can suppress the labor cost for support and maintenance work, and the cost for providing software can be reduced. The service provider often can construct an application not dependent on the individual device configuration in the field of FA production line. Especially in the field of board packaging technique, an application which can meet the requirements of a great number of types and models of the printed board can be constructed. The customer is not required to completely fix the device configuration of the line associated with the application. The customer can change the device configuration of the production line associated with the application program within the scope of the contract without connecting the server. Especially for the production line in the field of board packaging, the requirement for the multi-item scant production of boards can be met by the fact that the device configuration can be changed without server connection. The service provider, while permitting the customer to change the device covered by the application program, can set the scope of allowance for each customer. The service provider can charge each customer in a versatile manner with the specific charge or regular charge on the basis of the charge execution history uploaded from the client machine. The customer can be charged in a convincing way in accordance with the substantive amount of the service received. The customer is not required to establish the internet connection environment at the production site for receiving the service. The confidential information for the customer such as the production information output from the devices on the production line can be completely prevented from leaking through the internet.

This application claims priority from Japanese Patent Applications 2002-290379, 2003-012859 and 2003-312739, filed Oct. 2, 2002, Jan. 21, 2003 and Sep. 4, 2003, which is incorporated herein by reference in their entirety.

What is claimed is:

1. A method for use with a system comprising a board packaging line coordinating computer connected with devices constituting a board packaging line through a network and an application server for storing application programs to be provided to the board packaging line coordinating computer, the board packaging line coordinating computer and the application server being connected to each other through an internet, the method comprising:
    downloading service contract information and an application program from the application server to the board packaging line coordinating computer, wherein the service contract information is based on a contract with a customer, and the application program is stipulated in the contract information;
    defining, via the board packaging line coordinating computer, a board packaging line and a device configuration of the board packaging line covering the application program based on the contract information;
    uploading the defined device configuration to the application server from the board packaging line coordinating computer;
    retrieving, via the application server, a required device driver from a prepared group of device drivers based on the defined device configuration uploaded from the board packaging line coordinating computer;
    downloading the retrieved device driver from the application server to the board packaging line computer; and
    setting the downloaded device driver in each device of the board packaging line.

2. The method according to claim 1, wherein the application program is configured to provide at least one of the operations of set-up management, time-lapse variation management, or defect cause estimation.

3. The method according to claim 1,
    wherein the service contract information contains information for identifying the board packaging line coordinating computer, information for identifying the board packaging line, information for identifying the application program covering the board packaging line, information regarding a number of registered devices on the board packaging line, and information regarding a number of changeable devices on the board packaging line.

4. The method according to claim 3, further comprising:
    setting an input/output correspondence between the application program and applicable devices, via the board packaging line coordinating computer, based on the information for identifying the board packaging line, the information for identifying the application program covering the board packaging line, and information regarding the number of registered devices on the board packaging line.

5. The method according to claim 4,
    wherein when the device configuration of the board packaging line changes after introducing a predetermined application program to the board packaging line and a scope of change in the device configuration is not more than the number of changeable devices contained in the service contract information, changing the device configuration covering the line, via the board packaging line coordinating computer, without changing the terms and conditions of the contract, and setting a device driver corresponding to the changed device configuration in each device of the board packaging line while at the same time newly setting a data input/output correspondence between the application program and the changed device configuration.

6. The method according to claim 4, wherein when the device configuration of the board packaging line changes after introducing a predetermined application program to the board packaging line and a scope of change in the device configuration is not more than the number of changeable devices contained in the service contract information, changing the device configuration covering the line via the board packaging line coordinating computer without changing the terms and conditions of the contract, and wherein when a device driver corresponding to the changed device configuration cannot be set, uploading the changed device configuration from the board packaging line coordinating computer to the application server;

retrieving a required changed device driver via the application server based on the uploaded changed device configuration;

downloading the retrieved changed device driver from the application server; and setting the retrieved changed device driver in each device of the board packaging line.

7. The method according to claim 3, wherein the service contract information further contains an effective period during which the application program is usable, and wherein when the application program is to be executed by the board packaging line coordinating computer, prohibiting the execution of the application program at a time other than the effective period.

8. The method according to claim 7, collecting and storing, via the board packaging line coordinating computer, actually used data for the application program including at least one of a total execution time of the application program, a total standby time of the application program, a number of times a specific algorithm is operated in the application program, a number of times the operation result is displayed, a number of boards processed, or a number of specific boards extracted; and performing, via the application server, a variety of specific charges in accordance with predetermined charge conditions based on the actually used data.

9. The method according to claim 3, wherein the service contract information contains a cycle period for which actually used data of the application program are to be transmitted and the service contract information is to be updated, and wherein when the actually used data of the application program is not transmitted or the service contract information is not updated by the board packaging line coordinating computer for a time amount longer than the cycle period, prohibiting the execution of the application program.

10. The method according to claim 3, conducting, via the board packaging line coordinating computer, an internet communication with the application server through a communication client.

11. A system comprising:

a board packaging line coordinating computer connected by a local area network (LAN) with each device constituting a board packaging line; and an application server for storing application programs to be provided to the board packaging line coordinating computer connected with the board packaging line coordinating computer through an internet, wherein the board packaging line coordinating computer comprises:

means for downloading, from the application server, service contract information and an application program, wherein the service contract information is based on a contract signed with a customer, and the application program is stipulated in the contract information;

means for defining a board packaging line covered by the application program and a device configuration of the board packaging line based on the contract information;

means for uploading the defined device configuration to the application server; and means for downloading a retrieved device driver from the application server and setting the downloaded device driver in each device of the board packaging line; and wherein the application server includes means for retrieving a required device driver from a group of prepared device drivers to provide the retrieved device driver, based on the defined device configuration uploaded from the means for uploading the defined device configuration.

12. A system comprising:

a board packaging line coordinating computer connected by a local area network (LAN) to each device constituting a board packaging line;

a communication client computer configured to transmit information through a removable medium to and from the board packaging coordinating computer, and;

an application server for storing application programs to be provided to the board packaging line coordinating computer, the application server and the communication client computer being connected to each other by an internet;

wherein the board packaging line coordinating computer includes:

means for downloading a service contract information and an application program from the application server through a communication client and a removable medium, wherein the service contract information is based on a contract signed with a customer and the application program is stipulated in the contract information;

means for defining a board packaging line covered by the application program and a device configuration of the board packaging line based on the contract information;

means for uploading the defined device configuration to the application server through the communication client and the removable medium to the application server;

means for downloading a retrieved device driver from the application server through the communication client and the removable medium;

means for setting the retrieved device driver in each device of the board packaging line via the LAN; and wherein the application server includes means for retrieving a required device driver from a group of prepared device drivers to provide the retrieved device driver, based on the defined device configuration uploaded from the means for uploading the defined device configuration through the communication client and the removable medium.

* * * * *